United States Patent
Ohashi

(10) Patent No.: US 8,562,154 B2
(45) Date of Patent: Oct. 22, 2013

(54) VIBRATOR DRIVING METHOD, VIBRATING APPARATUS, DRIVING APPARATUS HAVING VIBRATING APPARATUS, FOREIGN SUBSTANCE REMOVING APPARATUS HAVING VIBRATING APPARATUS, AND OPTICAL APPARATUS HAVING VIBRATING APPARATUS

(75) Inventor: Kaishi Ohashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 13/046,189

(22) Filed: Mar. 11, 2011

(65) Prior Publication Data
US 2011/0228389 A1    Sep. 22, 2011

(30) Foreign Application Priority Data
Mar. 16, 2010   (JP) ................. 2010-058772

(51) Int. Cl.
*G02B 1/00*   (2006.01)
(52) U.S. Cl.
USPC .......................................... 359/507; 359/508
(58) Field of Classification Search
USPC ................................................. 359/507, 508
See application file for complete search history.

(56) References Cited

U.S. PATENT DOCUMENTS

| 4,181,027 | A  | * | 1/1980 | Talbott, Jr. ............. | 73/665 |
| 5,850,117 | A  |   | 12/1998 | Tobe et al. | |
| 7,034,438 | B2 |   | 4/2006 | Ohashi et al. | |
| 7,499,639 | B2 | * | 3/2009 | Kawai ............. | 396/111 |
| 7,580,628 | B2 | * | 8/2009 | Ide et al. ............. | 396/429 |
| 7,969,500 | B2 | * | 6/2011 | Urakami ............. | 348/335 |
| 8,091,167 | B2 | * | 1/2012 | Teo et al. ............. | 15/1.51 |
| 8,437,631 | B2 | * | 5/2013 | Matsumoto ............. | 396/429 |
| 2008/0226285 | A1 |   | 9/2008 | Matsumoto | |
| 2009/0153966 | A1 |   | 6/2009 | Matsumoto | |
| 2009/0207493 | A1 |   | 8/2009 | Ohashi | |
| 2010/0171872 | A1 | * | 7/2010 | Okano ............. | 348/360 |

FOREIGN PATENT DOCUMENTS

JP     2010-68276 A    3/2010

* cited by examiner

*Primary Examiner* — Frank Font
(74) *Attorney, Agent, or Firm* — Fitzpatrick, Cella, Harper & Scinto

(57) ABSTRACT

A driving method causes a vibrator to generate standing waves different in order with a predetermined time phase difference. The vibrator has a first vibration mode in which plural nodal lines are arranged in a first direction, a second vibration mode in which a number of first-direction nodal lines is different from that in the first vibration mode and its natural frequency is higher than that of the first vibration mode, and a third vibration mode having a natural frequency between those of the first and second vibration modes. The vibrator is driven on condition that an excitation force applied to one of the first and second vibration modes, in which a difference between its natural frequency and the natural frequency of the third vibration mode is smaller, is made larger than that applied to the other thereof, in which a difference between its natural frequency and the natural frequency of the third vibration mode is larger.

10 Claims, 15 Drawing Sheets

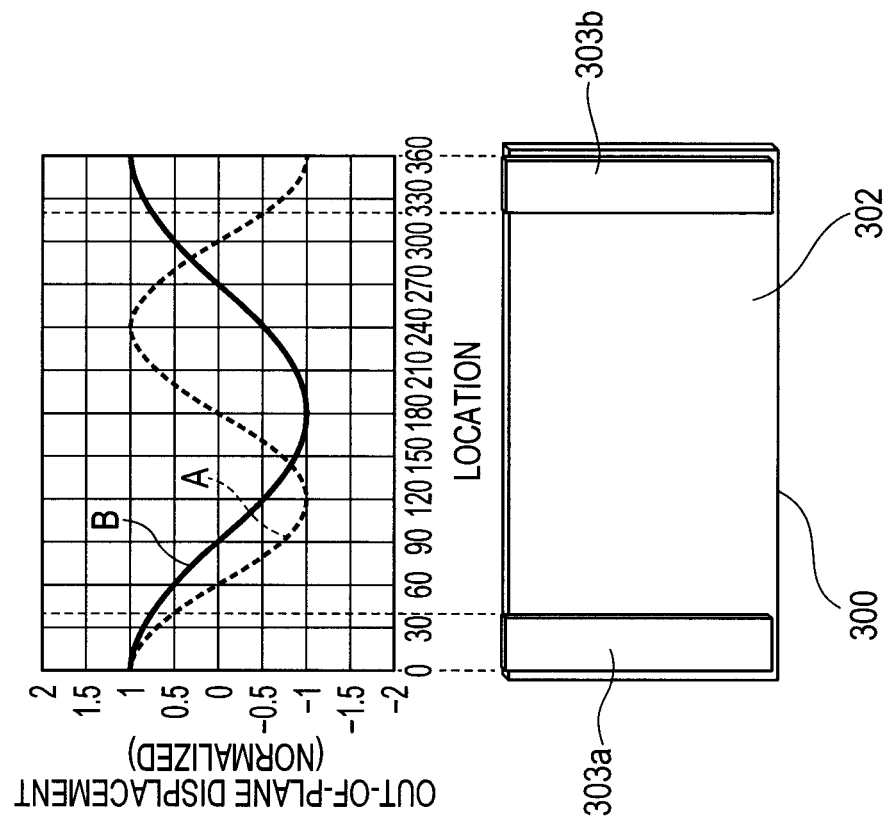
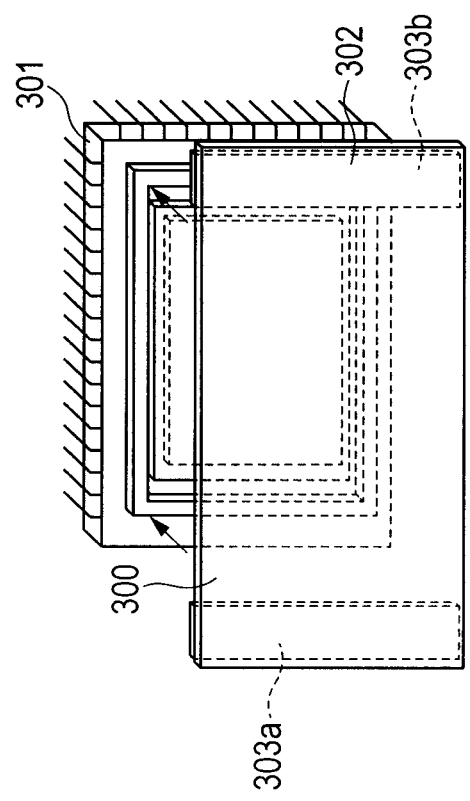

VIBRATOR DRIVING METHOD, VIBRATING APPARATUS, DRIVING APPARATUS HAVING VIBRATING APPARATUS, FOREIGN SUBSTANCE REMOVING APPARATUS HAVING VIBRATING APPARATUS, AND OPTICAL APPARATUS HAVING VIBRATING APPARATUS

BACKGROUND OF THE INVENTION

1. Field of the Invention

The present invention relates to a vibrator driving method and a vibrating apparatus. In particular, the present invention relates to a vibrating apparatus which is used in a foreign substance removing apparatus of an optical apparatus such as a camera, a facsimile apparatus, a scanner, a projector, a copying machine, a laser beam printer, an inkjet printer, a lens, binoculars, an image displaying apparatus or the like, and a driving apparatus which drives an object by vibration.

2. Description of the Related Art

In recent years, with improvement of resolution of an optical sensor in an image pickup apparatus, an adverse influence of a foreign substance adhering to an optical system during operation of the apparatus, on a picked-up image, has come to be considered increasingly serious.

In particular, since the resolution of an image pickup element used in a video camera or a still camera has been remarkably improved, a defect in image arises if the foreign substance adheres to an optical component disposed in the vicinity of the image pickup element.

For example, if a foreign substance such as dust from outside the apparatus or abrasion powder produced on a mechanical sliding surface within the apparatus adheres to an infrared cut filter, an optical low-pass filter or the like, the foreign substance is taken in a picked-up image since an image rarely blurs on the surface of the image pickup element.

On another front, an image pickup unit of a copying apparatus, a facsimile apparatus, a scanner or the like reads a plane original by causing a line sensor to perform scanning or scanning an original brought close to the line sensor.

In this case, if a foreign substance adheres to a light ray incident unit of the line sensor through which light enters the line sensor, the foreign substance is taken in a scanned image.

In a so-called moving original reading method in which an original is read during conveyance from a reading unit of an original scanning apparatus, a reading unit of a facsimile apparatus, or an automatic document feeder of a copying apparatus, one foreign substance is taken as a linear image which extends in an original feeding direction. Thus, a problem of degrading image quality is caused.

The image quality can be recovered by manually wiping off the foreign substance. However, a foreign substance which adheres to the light ray incident unit during an operation of the apparatus cannot be recognized until after an image has been picked up.

Namely, if the image is picked up or scanned before the foreign substance is wiped off, an image of the foreign substance is taken in the picked-up image, whereby image correction by software is required. Besides, in the case of a copying machine, such an image is output onto a paper medium simultaneously, whereby it takes a great deal of labor to correct the image.

To solve this kind of problem, a foreign substance removing apparatus which moves a foreign substance from an image reading unit by giving a vibration, and an optical apparatus which is equipped with the relevant foreign substance removing apparatus have been proposed conventionally (United States Patent. Application Publication US2009/0207493.)

FIG. 11A is a diagram illustrating a constitution of a vibrating apparatus provided in the conventional foreign substance removing apparatus disclosed in United States Patent. Application Publication US2009/0207493.

A vibrating apparatus 300 is provided on an image pickup apparatus 301 which converts an object image received into an electrical signal to thereby generate image data.

A space formed on the front surface of the image pickup apparatus 301 is hermetically sealed by the vibrating apparatus 300 and the image pickup apparatus 301.

The vibrating apparatus 300 includes a rectangular-plate optical element 302, and a pair of piezoelectric elements 303a and 303b which act as electromechanical energy conversion elements and are rigidly glued to respective opposite ends of the optical element.

An alternating voltage Va is applied to the piezoelectric element 303a, and an alternating voltage Vb is applied to the piezoelectric element 303b.

In FIG. 11B, a waveform A indicates a displacement distribution of a first-order out-of-plane bending vibration, and a waveform B indicates a displacement distribution of a second-order out-of-plane bending vibration.

The axis of ordinate indicates the out-of-plane displacement of the surface of the vibrating apparatus 300 opposite to the surface on which the image pickup apparatus 301 is arranged, and the direction toward the side of the image pickup apparatus 301 is set to be negative. On the other hand, as illustrated in the drawing, the axis of abscissa corresponds to the locations of the vibrating apparatus 300 in the longitudinal direction.

Each of the alternating voltages Va and Vb is the alternating voltage of which the period has a response of the resonance phenomenon and the first-order out-of-plane bending vibration and the second-order out-of-plane bending vibration. Further, the time phases of the alternating voltages Va and Vb are different from each other.

Thus, a vibration which is obtained by combining the two vibrations of the first-order out-of-plane bending vibration and the second-order out-of-plane bending vibration respectively having the different time phases is excited in the vibrating apparatus 300.

FIGS. 12, 13, 14 and 15 are graphs indicating respective displacements and displacement speeds of the first-order out-of-plane bending vibration and the second-order out-of-plane bending vibration in a case where the time phase difference between the two vibrations is set to 90° and the amplitudes of the two vibrations are set to be 1:1, and displacements and displacement speeds of the vibrator resulting from superposition of the two vibrations, on a time phase-by-time phase basis.

In each of these drawings, the axis of ordinate indicates the displacement and the displacement speed, and the direction toward the side of the image pickup apparatus 301 is set to be negative. On the other hand, as well as FIG. 11B, the axis of abscissa corresponds to the locations of the vibrating apparatus 300 in the longitudinal direction.

In the drawings, a waveform C represents the displacement of the first-order out-of-plane bending vibration, and a waveform D represents the displacement of the second-order out-of-plane bending vibration. A waveform E represents the displacement of the vibrator 300 resulting from superposition of the two vibrations. A waveform G represents the displacement of the vibrator 300 in a 30° earlier time phase than the time phase of the waveform E. A waveform F represents the normalized displacement speed of the vibrator 300.

In a case where the foreign substance removing apparatus is operated, when the optical element 302 thrusts up a foreign substance out of plane (i.e., in the positive direction on the axis of ordinate in each of FIGS. 12 to 15), the foreign substance on the front surface of the optical element 302 receives a force in the normal direction and is moved in a repelled fashion.

More specifically, if the waveform F indicative of the displacement speed assumes a positive value in each time phase, the foreign substance is thrust up out of plane, and receives a force in the normal direction of the waveform E indicative of the displacement of the vibrating apparatus 300 in this time phase to be moved away. In a case where the displacement is given with the optical element 302 raised at a certain angle (typically in a vertical direction), if the foreign substance on the front surface of the optical element 302 receives the force in the normal direction and is moved away, the moved-away foreign substance does not again adhere to the relevant surface with a fixed probability but falls by gravity.

Each of arrows h in FIGS. 12 to 15 indicates a direction in which the foreign substance moves.

As can be understood from FIGS. 12 to 15, from the location 60 to the location 300 of the optical element 302, an amount of vibration for moving the foreign substance in the positive direction on the axis of abscissa is much larger than an amount of vibration for moving the foreign substance in the negative direction on the axis of abscissa during one period of vibration. Consequently, the foreign substance can be moved in the positive direction on the axis of abscissa.

If the valid portion of the optical element 302 which is valid in regard to the image pickup apparatus 301 is within the range from the location 60 to the location 300, the foreign substance can be removed from the valid portion.

However, such problems as described below arise in the above-described vibrating apparatus. Namely, in United States Patent Application Publication US2009/0207493, since the vibrating apparatus has numerous vibration modes, unnecessary vibration modes other than desired two vibration modes mixedly exist.

Namely, since the unnecessary vibration modes mixedly exist, a place where the in-plane directions at the time when the foreign substance on the front surface of the optical element is thrust up out of plane are opposite to each other, and a place where the component in the in-plane direction is small arise.

Further, in some places, the foreign substances cannot be moved because the in-plane moving directions face to each other, or moving force becomes small in regard to adhesion of the foreign substance. Thus, efficiency of moving the foreign substance lowers.

The present invention, which has been completed in consideration of the above-described problems, aims to provide a vibrator driving method which enables to effectively move an object including a foreign substance in a predetermined direction by vibration, a vibrating apparatus which uses the vibrator driving method, and a driving apparatus, a foreign substance removing apparatus and an optical apparatus each of which has the vibrating apparatus.

SUMMARY OF THE INVENTION

The present invention is to provide a vibrator driving method which will be described as below and, a vibrating apparatus of the constitution will be described as below, and a driving apparatus, a foreign substance removing apparatus and an optical apparatus each of which has the vibrating apparatus.

Here, the vibrator driving method according to the present invention is a vibrator driving method of applying an alternating voltage to at least two electromechanical energy conversion elements provided in a vibrator, and thus causing the vibrator to generate standing waves respectively different in order with a predetermined time phase difference: wherein the vibrator has a first vibration mode in which plural nodal lines are arranged in a first direction, a second vibration mode in which the number of nodal lines arranged in the first direction is different from that in the first vibration mode and of which a natural frequency is higher than a natural frequency of the first vibration mode, and a third vibration mode of which a natural frequency is located between the natural frequency of the first vibration mode and the natural frequency of the second vibration mode; the number of nodal lines arranged in the first direction in the third vibration mode is the same as that in the first vibration mode or that in the second vibration mode, and the number of nodal lines arranged in a second direction intersecting with the first direction in the third vibration mode is different from that in the first vibration mode or that in the second vibration mode; and the vibrator is driven on condition that excitation force to one of the first vibration mode and the second vibration mode in which a difference between the natural frequency thereof and the natural frequency of the third vibration mode is smaller is made larger than excitation force to the other of the first vibration mode and the second vibration mode in which a difference between the natural frequency thereof and the natural frequency of the third vibration mode is larger.

Further, the vibrating apparatus according to the present invention is a vibrating apparatus which comprises a vibrator having at least two electromechanical energy conversion elements, and applies an alternating voltage to the electromechanical energy conversion elements and thus causes the vibrator to generate standing waves respectively different in order with a predetermined time phase difference: wherein the vibrator has a first vibration mode in which plural nodal lines are arranged in a first direction, a second vibration mode in which the number of nodal lines arranged in the first direction is different from that in the first vibration mode and of which a natural frequency is higher than a natural frequency of the first vibration mode, and a third vibration mode of which a natural frequency is located between the natural frequency of the first vibration mode and the natural frequency of the second vibration mode; the number of nodal lines arranged in the first direction in the third vibration mode is the same as that in the first vibration mode or that in the second vibration mode, and the number of nodal lines arranged in a second direction intersecting with the first direction in the third vibration mode is different from that in the first vibration mode or that in the second vibration mode; at least one of the electromechanical energy conversion elements has divided electrodes pluralized; and a dividing location of the divided electrode is set to be closer to a location of the nodal line of one of the first vibration mode and the second vibration mode in which a difference between the natural frequency thereof and the natural frequency of the third vibration mode is smaller, than a location of the nodal line of the other of the first vibration mode and the second vibration mode in which a difference between the natural frequency thereof and the natural frequency of the third vibration mode is larger.

Furthermore, the driving apparatus according to the present invention is a driving apparatus which comprises a vibrating apparatus using the above-described vibrator driving method or the above-described vibrating apparatus, wherein the driving apparatus drives an object in a predetermined direction by the vibrating apparatus.

Furthermore, the foreign substance removing apparatus according to the present invention is a foreign substance removing apparatus which comprises a vibrating apparatus using the above-described vibrator driving method or the above-described vibrating apparatus, wherein the foreign substance removing apparatus removes a foreign substance by moving it in a predetermined direction by the vibrating apparatus.

Furthermore, the optical apparatus according to the present invention is an optical apparatus which comprises the above-described foreign substance removing apparatus, wherein the optical apparatus removes a foreign substance on an optical path by the foreign substance removing apparatus.

According to the present invention, it is possible to achieve the vibrator driving method which enables to effectively move an object including a foreign substance in a predetermined direction by vibration, the vibrating apparatus which uses the vibrator driving method, and the driving apparatus, the foreign substance removing apparatus and the optical apparatus each of which has the vibrating apparatus.

Further features and aspects of the present invention will become apparent from the following detailed description of exemplary embodiments with reference to the attached drawings.

BRIEF DESCRIPTION OF THE DRAWINGS

FIG. 5A-1 is a perspective diagram illustrating a deformed shape of the optical element in a third vibration mode according to the first embodiment, FIG. 5A-2 is a diagram of the relevant deformed shape viewed from a first direction A in FIG. 5A-1, FIG. 5B-1 is a perspective diagram illustrating a deformed shape of the optical element in a fourth vibration mode according to the first embodiment, and FIG. 5B-2 is a diagram of the relevant deformed shape viewed from a first direction A in FIG. 5B-1.

FIG. 11A is the diagram illustrating the constitution of the conventional vibrating apparatus, and FIG. 11B is the diagram illustrating the displacement distributions of the first-order out-of-plane bending vibration and the second-order out-of-plane bending vibration and the arrangements of the piezoelectric elements, in the vibrator in the conventional vibrating apparatus.

DESCRIPTION OF THE EMBODIMENTS

First of all, it should be noted that, in the present invention, an electromechanical energy conversion element includes a region which independently functions as the electromechanical energy conversion element. Consequently, for example, if electrically independent electrodes are provided respectively in plural regions in one piezoelectric body, although these regions constitute one piezoelectric body as a whole, this piezoelectric body includes plural piezoelectric elements.

Hereinafter, exemplary embodiments of the present invention will be described with reference to the attached drawings.

[First Embodiment]

A constitutional example of a vibrating apparatus provided in a camera, according to the first embodiment of the present invention, will be described with reference to FIG. 1.

The vibrating apparatus in the present embodiment functions as a foreign substance removing apparatus which removes a foreign substance by moving it.

Figure 1:
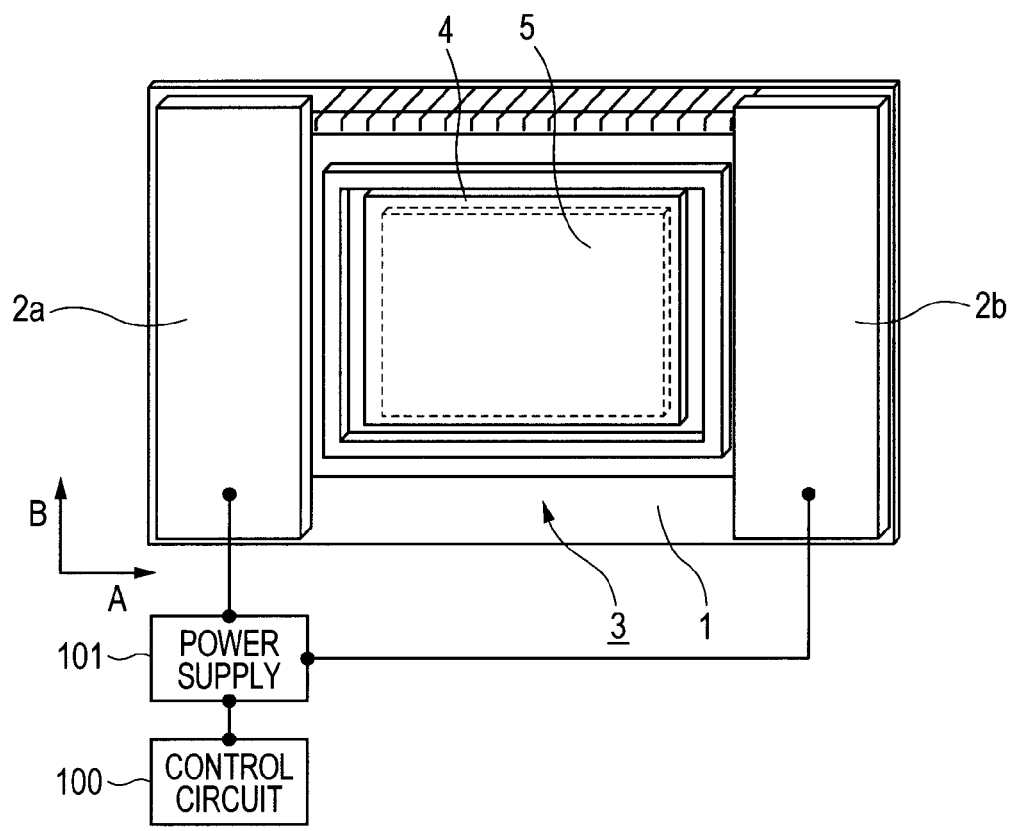
FIG. 1 is a diagram illustrating a vibrating apparatus according to a first embodiment of the present invention.

In an optical element 1 illustrated in FIG. 1, a piezoelectric element 2 which consists of two electromechanical energy conversion elements (illustrated as piezoelectric elements 2a and 2b) is rigidly glued to the surface on the same side of the side of an image pickup element 4.

A control circuit 100 sets a frequency, a voltage value and a time phase of an alternating voltage generated by a power supply 101. The power supply 101 is electrically connected to the piezoelectric elements 2a and 2b.

The optical element 1 and the piezoelectric element 2 together constitute a vibrator 3. The vibrator 3 is attached to the image pickup element 4 acting as a light receiving element so that a space formed on the front surface of the image pickup element 4 is hermitically sealed.

Incidentally, light from an object is incident to the image pickup element 4 through the optical element 1. Here, a range in which the light incident to the image pickup element passes through the optical element 1 corresponds to an optical valid portion 5.

Also in the present embodiment, as well as United States Patent. Application Publication US2009/0207493, two different-order out-of-plane bending vibrations in which nodal lines are respectively arranged in the same direction are excited with a different time phase. Here, the nodal line in the present invention is equivalent to a virtual line which is formed in a case where, when a standing wave is generated on the surface of a vibration object (e.g., an optical element) by vibrating a predetermined surface of the vibration object, the portions becoming nodes of the standing wave are connected to others.

Consequently, in the present embodiment, the control circuit 100 sets the frequency of the alternating voltage generated by the power supply 101 to a frequency which has a response in both a tenth-order out-of-plane bending vibration mode (first vibration mode) and an eleventh-order out-of-plane bending vibration mode (second vibration mode) in which the nodal lines are arranged in the right-and-left direction on the drawing sheet (i.e., a first direction indicated by an arrow A in the drawing) and which are different in order.

Figure 2A:
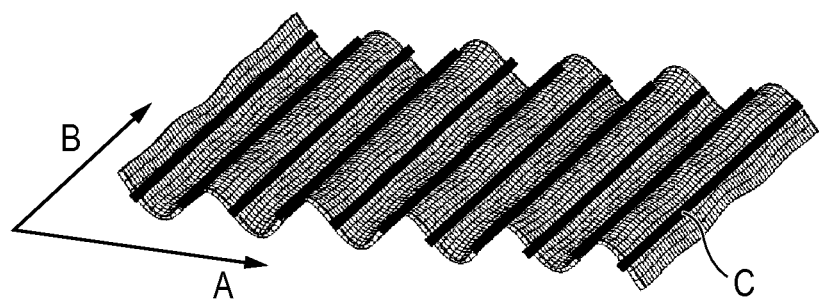
FIG. 2A is a perspective diagram illustrating a deformed shape of an optical element in a first vibration mode according to the first embodiment.
Figure 2B:
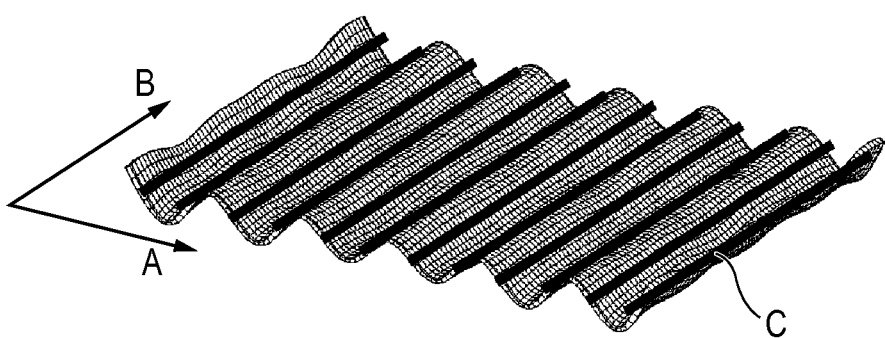
FIG. 2B is a perspective diagram illustrating a deformed shape of the optical element in a second vibration mode according to the first embodiment.

FIG. 2A is a perspective diagram illustrating a deformed shape of the optical element 1 in the first vibration mode, and FIG. 2B is a perspective diagram illustrating a deformed shape of the optical element 1 in the second vibration mode.

In each of FIGS. 2A and 2B, the arrow A indicates the first direction, and an arrow B indicates a second direction which intersects the first direction.

In the present embodiment, the first direction A and the second direction B are orthogonal to each other. A line C indicates the nodal line in the vibration mode. Namely, each of the first vibration mode and the second vibration mode has the plural nodal lines which are arranged in the first direction A.

The number of the nodal lines arranged in the first direction A is 11 in the first vibration mode, and 12 in the second vibration mode. Since order of out-of-plane bending deformation in the first vibration mode is less than that in the second vibration mode and a wavelength in the first vibration mode is longer than that in the second vibration mode, a natural frequency in the first vibration mode is lower than that in the second vibration mode.

The control circuit 100 sets a time phase difference between the two alternating voltages generated by the power supply 101. Consequently, the tenth-order out-of-plane bending vibration mode (first vibration mode) and the eleventh-order out-of-plane bending vibration mode (second vibration mode) are generated on the vibrator 3 with different time phases.

As well as United States Patent Application Publication US2009/0207493, in such a synthesized vibration, the in-plane directions at the time when the foreign substance is thrust up out of plane become identical on substantially the whole area of the front surface of the optical element 1.

Consequently, it is possible to achieve one-direction movement by applying in-plane one-direction force to all the objects including the foreign substances to be moved by vibration.

Figure 3:
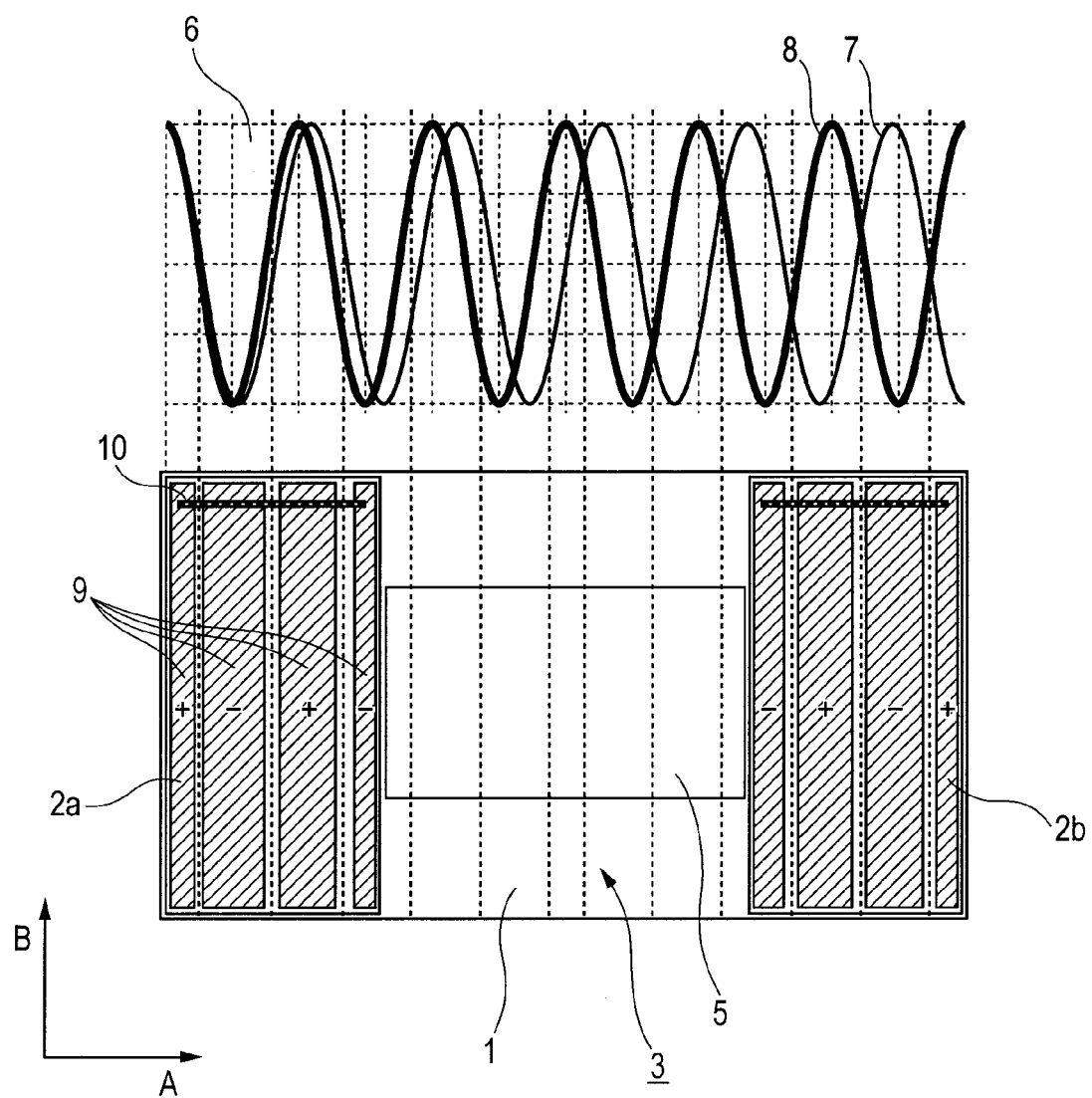
FIG. 3 is a diagram illustrating arrangements of nodal lines and piezoelectric elements in the first and second vibration modes and correspondence of electrode patterns according to the first embodiment of the present invention.

Subsequently, arrangements of the nodal lines and the respective piezoelectric elements 2 in the tenth-order out-of-plane bending vibration mode (first vibration mode) and the eleventh-order out-of-plane bending vibration mode (second vibration mode) and correspondence of the electrode patterns according to the present embodiment will be described with reference to FIG. 3.

A plot 6 indicates a displacement distribution (7 in the drawing) of the first vibration mode and a displacement distribution (8 in the drawing) of the second vibration mode both excited on the vibrator 3.

The axis of ordinate indicates the out-of-plane displacement of the optical element 1, and the direction thereof opposite to the surface on which the image pickup element 4 is arranged is set to be positive. The axis of abscissa corresponds to the locations of the optical element 1 in the right-and-left direction on the drawing sheet.

Further, in the present embodiment, a neutral plane of bending of such two vibrations constitutes the inside of the optical element 1. Deformation due to expansion and contraction arises in the right-and-left direction on the piezoelectric element 2 disposed at the positive place of deformation, and deformation due to expansion and contraction arises in the right-and-left direction of an opposite phase (180°) on the piezoelectric element 2 disposed at the negative place of deformation.

Each of the piezoelectric element 2a at the left end and the piezoelectric element 2b at the right end has a rectangular-plate shape, is arranged to extend from the end of the optical element 1 to the optical valid portion 5 in the right-and-left direction (first direction A), and is arranged to extend from one end to the other end of the optical element 1 in the up-and-down direction (second direction B).

Each of the piezoelectric elements 2a and 2b has a uniform electrode on the whole rear surface united to the optical element 1, and has plural divided electrodes (called divided electrodes 9, hereinafter) on the opposite front surface.

As indicated by the dotted lines in the drawing, each of the divided places of the divided electrodes 9 is set at the intermediate location between the place of the node at which the displacement in the displacement distribution 7 of the first vibration mode is approximately zero and the place of the node at which the displacement in the displacement distribution 8 of the second vibration mode is approximately zero.

In polarization, the electrode of the rear surface is set to ground potential. On the other hand, as indicated by symbols "+" and "−" in the drawing, different-polarity potentials are applied respectively to the adjacent electrodes on the front surface of the divided electrodes 9. More specifically, polarities "+", "−", "+" and "−" are applied in due order from the left to the divided electrodes of the left piezoelectric element 2a, and polarities "+", "−", "+" and "−" are applied in due order from the right to the divided electrodes of the right piezoelectric element 2b. A polarization direction is the thickness direction of the piezoelectric element 2, i.e., the direction orthogonal to the drawing sheet in FIG. 3.

After the polarization, a conductive coating material 10 having conductivity is applied so that it extends over the divided electrodes 9. Consequently, if voltage is applied to any place on the divided electrodes 9, the whole area of the divided electrodes 9 of the one piezoelectric element 2 has same potential.

If a polarity of the potential same as the polarity of the potential at the time of polarization is applied to the piezoelectric element 2, force extending in the direction orthogonal to the polarization direction arises. On the other hand, if a polarity of the potential different from the polarity of the potential at the time of polarization is applied to the piezoelectric element 2, force contracting in the direction orthogonal to the polarization direction arises. If alternating voltage is applied, periodical expansion/contraction force coinciding with the period of the alternating voltage arises.

Further, in the alternating voltage, a phase (0° or 180°) of the expansion/contraction in regard to the alternating voltage is determined according to the polarity at the time of polarization.

An alternating voltage $V1=A1 \times COS(2\pi ft)$ is applied to the left piezoelectric element 2a. Here, A1 indicates a voltage amplitude value, f indicates a frequency, and t indicates a time.

On the other hand, a voltage $V2=A2 \times COS(2\pi ft+)$ of which the time phase is different from that of the voltage V1 by is applied to the right piezoelectric element 2b. Here, A2 indicates a voltage amplitude value.

At this time, a voltage which mainly contributes to the tenth-order out-of-plane bending vibration mode (first vibration mode 7) in which the piezoelectric elements 2a and 2b respectively form the opposite-phase bending deformations is equivalent to a voltage V (difference) corresponding to the component of the difference between the alternating voltages V1 and V2, whereby V (difference)=V1−V2 is given.

On the other hand, a voltage which mainly contributes to the eleventh-order out-of-plane bending vibration mode (second vibration mode 8) in which the piezoelectric elements 2a and 2b respectively form the same-phase bending deformations is equivalent to a voltage V (sum) corresponding to the component of the sum of the alternating voltages V1 and V2, whereby V (sum)=V1+V2 is given.

Here, the phase of the expansion/contraction force which arises by the voltage V (difference) in the piezoelectric element 2 will be described by using the voltage V (difference) as a reference of phase.

The distribution of the phase of the expansion/contraction force of the left piezoelectric element 2a is 0°, 180°, 0°, 180° from the left in correspondence with the divided electrodes 9, and the distribution of the phase of the expansion/contraction force of the right piezoelectric element 2b is 180°, 0°, 180°, 0° from the right.

The relevant distribution of the phase of the expansion/contraction force approximately matches the distribution of the phase of the expansion/contraction deformation of the piezoelectric element 2 by the displacement distribution 7 in the tenth-order out-of-plane bending vibration mode (first vibration mode).

Consequently, it is possible to obtain the large vibration in the tenth-order out-of-plane bending vibration mode (first vibration mode).

On the other hand, the distribution of the phase of the expansion/contraction force matches the distribution of the phase of the expansion/contraction deformation of the piezoelectric element 2 by the displacement distribution 8 in the eleventh-order out-of-plane bending vibration mode (second vibration mode) on the left piezoelectric element 2a, and is inverted on the right piezoelectric element 2b.

With respect to the eleventh-order out-of-plane bending vibration mode (second vibration mode) by the voltage V (difference), since the magnitudes of the vibration excited by the left piezoelectric element 2a and the vibration excited by the right piezoelectric element 2b are equal to each other and the phases thereof are opposite to each other, these vibrations are canceled out.

Consequently, the vibration in the eleventh-order out-of-plane bending vibration mode (second vibration mode) does not arise.

Further, with respect to the vibration mode in which the number of nodes in the right-and-left direction is different from that in the tenth-order out-of-plane bending vibration mode (first vibration mode), the distribution of the phase of the expansion/contraction force and the distribution of the phase of the deformation are different, whereby the vibrations are canceled out. Thus, it is possible to reduce the vibration.

Subsequently, the phase of the expansion/contraction force which arises by the voltage V (sum) in the piezoelectric element 2 will be described by using the voltage V (sum) as a reference of phase.

The distribution of the phase of the expansion/contraction force of the left piezoelectric element 2a is 0°, 180°, 0°, 180° from the left in correspondence with the divided electrodes 9, and the distribution of the phase of the expansion/contraction force of the right piezoelectric element 2b is 0°, 180°, 0°, 180° from the right.

The relevant distribution of the phase of the expansion/contraction force approximately matches the distribution of the phase of the expansion/contraction deformation of the piezoelectric element 2 by the displacement distribution 8 in the eleventh-order out-of-plane bending vibration mode (second vibration mode). Consequently, it is possible to obtain the large vibration in the eleventh-order out-of-plane bending vibration mode (second vibration mode).

With respect to the tenth-order out-of-plane bending vibration mode (first vibration mode) by the expansion/contraction force of the voltage V (sum), the magnitudes of the vibration excited by the left piezoelectric element 2a and the vibration excited by the right piezoelectric element 2b are equal to each other and the phases thereof are opposite to each other. Consequently, the vibration in the tenth-order out-of-plane bending vibration mode (first vibration mode) does not arise.

Further, with respect to the vibration mode in which the number of nodes in the right-and-left direction is different from that in the eleventh-order out-of-plane bending vibration mode (second vibration mode), the distribution of the phase of the expansion/contraction force and the distribution of the phase of the deformation are different, whereby it is possible to reduce the vibration by an effect of canceling out the vibrations.

Since the time phase difference is provided in the excitation voltage V (difference) for the first vibration mode and the excitation voltage V (sum) for the second vibration mode, the time phase difference is provided in the first vibration mode and the second vibration mode.

Consequently, it is possible to achieve one-direction movement by applying in-plane one-direction force to all the objects including the foreign substances to be moved by vibration.

Here, the problem in the related background art (United States Patent Application Publication US2009/0207493) will further be described in detail.

Figure 4:
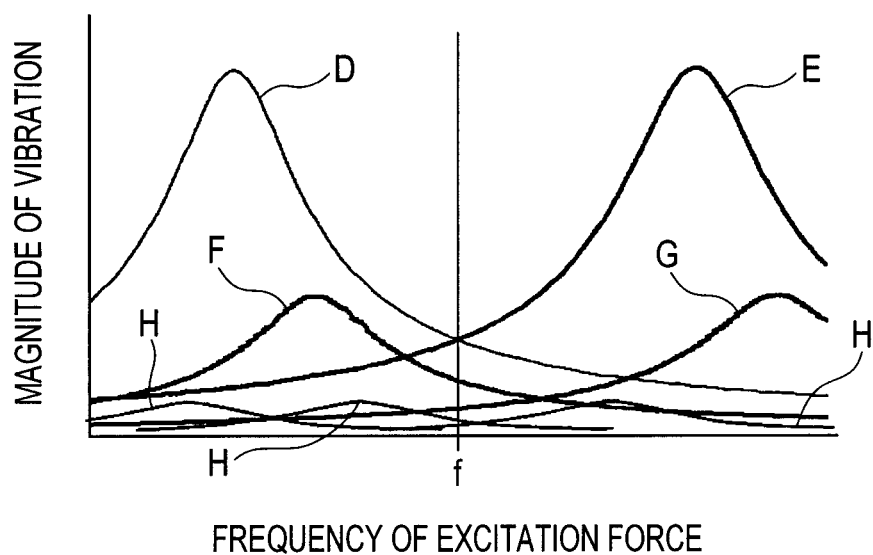
FIG. 4 is a diagram illustrating frequencies of excitation force and magnitudes of vibrations in the respective vibration modes in the related background art.

FIG. 4 is a graph indicating the frequencies of the excitation force and the magnitudes of the vibrations in the respective vibration modes in a case where the magnitudes of the excitation forces in the two vibration modes to be synthesized are set to be the same, as in the related background art (United States Patent Application Publication US2009/0207493).

In the present embodiment, the above case corresponds to a case where the magnitude of the voltage V (difference) and the magnitude of the voltage V (sum) are set to be the same. In the drawing, D in the plot indicates the magnitude of the vibration in the first vibration mode, and E in the plot indicates the magnitude of the vibration in the second vibration mode.

Since the magnitudes of the excitation forces for these two vibration modes are the same, the magnitudes of the vibrations in the respective natural frequencies are the same.

Further, the magnitude of the vibration becomes small as the frequency of the excitation force goes away from each natural frequency. The magnitude of the vibration at the frequency that the frequency of the excitation force has the same difference from each of the respective natural frequencies is the same in both the first vibration mode D and the second vibration mode E.

As described above, the natural frequency in the first vibration mode D is lower than that in the second vibration mode E.

Incidentally, in the vicinity of the natural frequencies of these vibration modes, there are several other vibration modes (F, G and H in the plot of FIG. 4) in the vibrator 3.

Since distributions of displacements of other vibration modes are different from those of the first vibration mode D and the second vibration mode E, these modes are unnecessary vibration modes because they interfere with the driving of the foreign substances.

The vibration mode F is the vibration mode (third vibration mode) in which order of bending deformation in the right-and-left direction (first direction A) is the tenth-order out-of-plane bending deformation as well as the first vibration mode D and order of bending deformation in the up-and-down direction (second direction B) is the first-order out-of-plane bending deformation.

Figures 1, 5A:
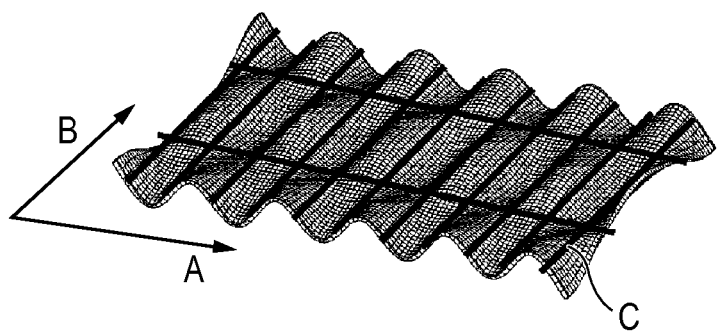
Figures 2, 5A:
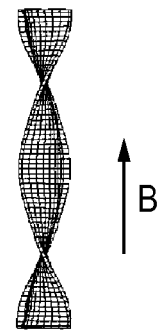

FIG. 5A-1 is a perspective diagram illustrating a deformed shape of the optical element 1 in the third vibration mode F, and FIG. 5A-2 is a diagram of the relevant deformed shape viewed from the first direction A in FIG. 5A-1.

The deformed shape in the third vibration mode F includes, in addition to the deformed shape in the first vibration mode D, deformation in the up-and-down direction (second direction B). For this reason, the third vibration mode has the natural frequency which is somewhat higher than that of the first vibration mode D.

Among many vibration modes, the vibration in the third vibration mode F is especially large.

The reason why the vibration in the third vibration mode F is especially large will be described hereinafter.

To generate the vibration in the first vibration mode D and the vibration in the second vibration mode E, alternating voltages are applied to the piezoelectric elements 2a and 2b so that expansion/contraction force arises in the right-and-left direction (first direction A), whereby bending deformation force arises in the direction of the vibrator 3.

As described above, the dividing location of the divided electrodes 9 is near the locations of the nodal lines in the first vibration mode D and the second vibration mode E.

On the other hand, in the third vibration mode F, a phase distribution of expansion/contraction deformation in the first direction A is near the phase distribution of the expansion/contraction force which arises in the piezoelectric element 2.

Consequently, the vibration in the third vibration mode F is large. Further, in the piezoelectric element 2, also the up-and-down direction (second direction B) is the direction orthogonal to the polarization direction, and expansion/contraction force arises in this direction, whereby the bending deformation force arises for the vibrator 3.

The third vibration mode F is the vibration mode in which bending deformation arises in the up-and-down direction (second direction B), whereby the vibration in the third vibration mode is further large.

Figures 1, 5B:
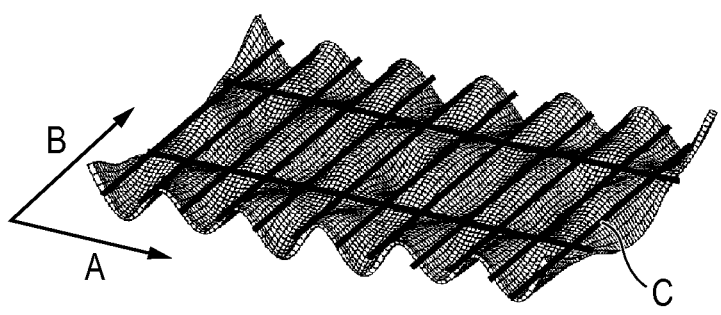
Figures 2, 5B:
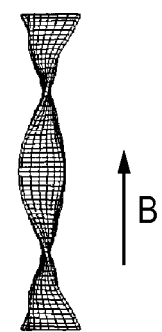

Likewise, the vibration in the vibration mode (fourth vibration mode), in which order of bending in the right-and-left direction (first direction A) of which the magnitude of the vibration is indicated by G in FIG. 4 is the eleventh-order out-of-plane bending deformation as well as the second vibration mode and the first-order out-of-plane bending deformation arises in the up-and-down direction (second direction B), is especially large. FIG. 5B-1 is a perspective diagram illustrating a deformed shape of the optical element 1 in the fourth vibration mode G, and FIG. 5B-2 is a diagram of the relevant deformed shape viewed from the first direction A in FIG. 5B-1.

The deformed shape in the fourth vibration mode G includes, in addition to the deformed shape in the second vibration mode E, deformation in the up-and-down direction (second direction B). For this reason, the fourth vibration mode G has the natural frequency which is somewhat higher than that of the second vibration mode E.

The displacement distributions in the up-and-down direction (second direction B) in the third vibration mode F and the fourth vibration mode G are different from those in the first vibration mode D and the second vibration mode E excited to move the foreign substances. Consequently, if the vibration in the third vibration mode F or the fourth vibration mode G is large, an uneven vibration arises in the up-and-down direction (second direction B), whereby a place where the foreign substance cannot be moved and a place where moving force is small occur. Thus, efficiency of moving the foreign substance lowers.

The vibration which is obtained by synthesizing the vibration in the first vibration mode D and the vibration in the second vibration mode E can be divided into a carrier wave component for moving the foreign substance and the like and a standing wave component. Here, the magnitudes of the vibrations in these vibration modes correspond to the magnitude of the carrier wave component.

Further, the magnitude of the remainder which is obtained by subtracting the magnitude of the carrier wave component from the magnitude of each vibration corresponds to the magnitude of the standing wave component corresponding to each vibration.

For example, it is assumed that, in the driving frequencies, the magnitude of the vibration in the first vibration mode D is Dd, the magnitude of the vibration in the second vibration mode E is Ed, and the magnitudes of these vibrations are different such as Dd>Ed. The magnitude Ed is the magnitude of the carrier wave component because both the magnitudes have at least the magnitude Ed. The magnitude of the remainder (Dd−Ed) is the magnitude of the standing wave component. Here, the standing wave component corresponds to the first vibration mode.

On the contrary, if the magnitudes of the vibrations are different such as Dd<Ed, the magnitude Dd is the magnitude of the carrier wave component, and the magnitude of the remainder (Ed−Dd) is the magnitude of the standing wave component. Here, the standing wave component corresponds to the second vibration mode. That is, in order to further move the foreign substance and the like by obtaining the larger carrier wave component, it is preferable to further enlarge both the magnitude Dd of the vibration in the first vibration mode D and the magnitude Ed of the vibration in the second vibration mode E.

If a frequency f (FIG. 4) which is intermediate between the natural frequency of the first vibration mode D and the natural frequency of the second vibration mode E is assumed as the driving frequency, both the first vibration mode D and the second vibration mode E have larger vibrations.

At this time, the magnitude of the vibration in the third vibration mode F and the magnitude of the vibration in the fourth vibration mode G are compared with each other. Namely, the magnitude of the vibration in the third vibration mode F is larger because the natural frequency of the third vibration mode F is located between the natural frequency of the first vibration mode D and the natural frequency of the second vibration mode E and a difference between the natural frequency and the driving frequency in the third vibration mode F is closer. In the example illustrated in FIG. 4, the magnitude of the vibration in the third vibration mode F is about half the magnitude of each of the vibration in the first vibration mode D and the vibration in the second vibration mode E, and the magnitude of the vibration in the fourth vibration mode G is about one-quarter the magnitude of each of the vibration in the first vibration mode D and the vibration in the second vibration mode E.

Consequently, the third vibration mode F interferes with movement of an object in one direction rather than the fourth vibration mode G. For this reason, in order to increase efficiency of moving the foreign substance, it is necessary to reduce the vibration in the third vibration mode.

In the present embodiment, the driving method in which the excitation voltage V (difference) for the first vibration mode is made higher than the excitation voltage V (sum) for the second vibration mode is adopted. That is, the driving method in which the excitation force to one of the first vibration mode and the second vibration mode in which the difference between the natural frequency thereof and the natural frequency of the third vibration mode is smaller is made larger than the excitation force to the other of the first vibration mode and the second vibration mode in which the difference between the natural frequency thereof and the natural frequency of the third vibration mode is larger is adopted.

Subsequently, a function effect by the driving method for the vibrator according to the present embodiment will further be described with reference to FIG. 6.

Figure 6:
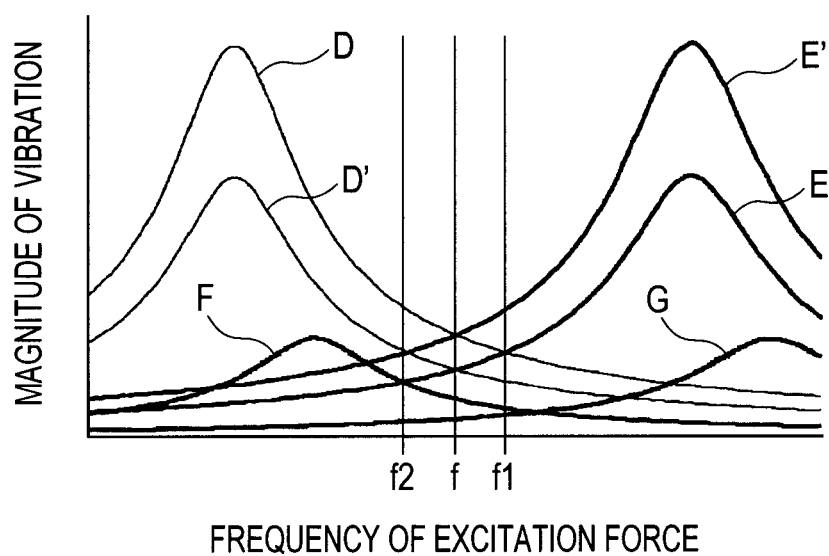
FIG. 6 is a diagram illustrating frequencies of excitation force and magnitudes of vibrations in the respective vibration modes in the first embodiment of the present invention.

FIG. 6 is a graph indicating the frequencies of the excitation force and the magnitudes of the vibrations in the respective vibration modes in the present embodiment.

In the drawing, D in the plot indicates the magnitude of the vibration in the first vibration mode, and E in the plot indicates the magnitude of the vibration in the second vibration mode. Further, F in the plot indicates the magnitude of the vibration in the third vibration mode, and G in the plot indicates the magnitude of the vibration in the fourth vibration mode.

Since the excitation voltage V (difference) for the first vibration mode D is made higher than the excitation voltage V (sum) for the second vibration mode E, the magnitude of the vibration at the natural frequency of the first vibration mode D is larger than the magnitude of the vibration at the natural frequency of the second vibration mode E.

Further, the magnitude of the vibration at the frequency where the frequency of the excitation force has the same difference from each of the natural frequencies in the first vibration mode D is larger than that in the second vibration mode E.

Since the deformed shape in the third vibration mode F is similar to that in the first vibration mode D, the vibration in the third vibration mode F is somewhat large at the frequency of any excitation force. At this time, the frequency of the excitation force capable of enlarging the vibrations in both the first vibration mode D and the second vibration mode E is given by f1, whereby the driving frequency is set to f1.

Further, E' in the plot indicates the magnitude of the vibration in the second vibration mode in the case where the magnitude of the voltage V (sum) and the magnitude of the voltage V (difference) are set to be the same, as in the related background art (United States Patent Application Publication US2009/0207493).

In this case, the frequency of the excitation force capable of enlarging the vibrations in both the first vibration mode D and the second vibration mode E' is given by f, whereby the driving frequency is set to f.

The difference between the driving frequency f1 in the present embodiment and the natural frequency of the third vibration mode F is larger than the difference between the driving frequency f in the related background art and the natural frequency of the third vibration mode F, whereby the magnitude of the vibration in the third vibration mode F in the present embodiment can be made smaller.

As described above, since the vibration in the third vibration mode F is large at the frequency of any excitation force, an amount of the relevant vibration is very small.

On the other hand, the difference between the driving frequency and the natural frequency of the fourth vibration mode G is small, and the vibration in the fourth vibration mode G is large. However, the value of the magnitude of the relevant vibration is still sufficiently small.

Thus, it is possible to decrease a response of an unnecessary vibration by distancing the driving frequency from a resonance frequency in the unnecessary vibration mode such as the third vibration mode or the fourth vibration mode, whereby it is possible to increase efficiency of moving the foreign substance.

Hereinafter, contrary to the present embodiment, a case of adopting a vibrator driving method in which the excitation force to one of the first vibration mode and the second vibration mode in which the difference between the natural frequency thereof and the natural frequency of the third vibration mode is larger is made larger than the excitation force to the other of the first vibration mode and the second vibration mode in which the difference between the natural frequency thereof and the natural frequency of the third vibration mode is smaller, by for example making the voltage (difference) smaller than the voltage (sum), will be described.

In this case, in the plot illustrated in FIG. 6, the magnitude of the vibration in the first vibration mode is indicated by D', and the magnitude of the vibration in the second vibration mode is indicated by E'.

At this time, the frequency of the excitation force capable of enlarging the vibrations in both the first vibration mode and the second vibration mode is given by f2, whereby the driving frequency is set to f2.

Since the difference between the driving frequency and the natural frequency of the third vibration mode F becomes small, the magnitude of the vibration in the third vibration mode F becomes large.

Consequently, as described above, the driving method in which the excitation force to one of the first vibration mode and the second vibration mode in which the difference between the natural frequency thereof and the natural frequency of the third vibration mode is smaller is made larger than the excitation force to the other of the first vibration mode and the second vibration mode in which the difference between the natural frequency thereof and the natural frequency of the third vibration mode is larger is adopted in the present embodiment.

[Second Embodiment]

Hereinafter, an example of the vibrator driving method according to the second embodiment of the present invention will be described.

In the present embodiment, the two vibrations which are synthesized to move the foreign substance are indicated by the vibration modes illustrated in FIGS. 5A-1, 5A-2, 5B-1 and 5B-2.

One vibration mode is the vibration mode (FIGS. 5A-1 and 5A-2) in which tenth-order out-of-plane bending deformation arises in the right-and-left direction (first direction A) and first-order out-of-plane bending deformation arises in the up-and-down direction (second direction B).

In the present embodiment, the relevant vibration mode is called a first vibration mode.

Next vibration mode is the vibration mode (FIGS. 5B-1 and 5B-2) in which eleventh-order out-of-plane bending deformation arises in the right-and-left direction (first direction A) and first-order out-of-plane bending deformation arises in the up-and-down direction (second direction B).

In the present embodiment, the relevant vibration mode is called a second vibration mode.

Each of the first vibration mode and the second vibration mode has plural nodal lines which are arranged in the first direction A. The number of the nodal lines arranged in the first direction A is 11 in the first vibration mode, and differently 12 in the second vibration mode. Since order of out-of-plane bending deformation in the first vibration mode is less than that in the second vibration mode and a wavelength in the first vibration mode is longer than that in the second vibration mode, a natural frequency in the first vibration mode is lower than that in the second vibration mode.

If the first and second vibration modes are generated with a time phase difference, the synthesized vibration acts as the vibration for moving the object in the first direction A.

The synthesized vibration has a feature which is able to effectively move the objects at the locations near the center, the upper end and the lower end when viewed along the up-and-down direction (second direction B).

Further, the locations of the nodal lines arranged in the up-and-down direction (second direction B) in the first vibration mode are approximately the same as the locations of the nodal lines arranged in the up-and-down direction (second direction B) in the second vibration mode.

Consequently, the magnitude of the vibrations at the relevant locations is approximately zero, whereby it is possible not to move the object.

Figure 7:
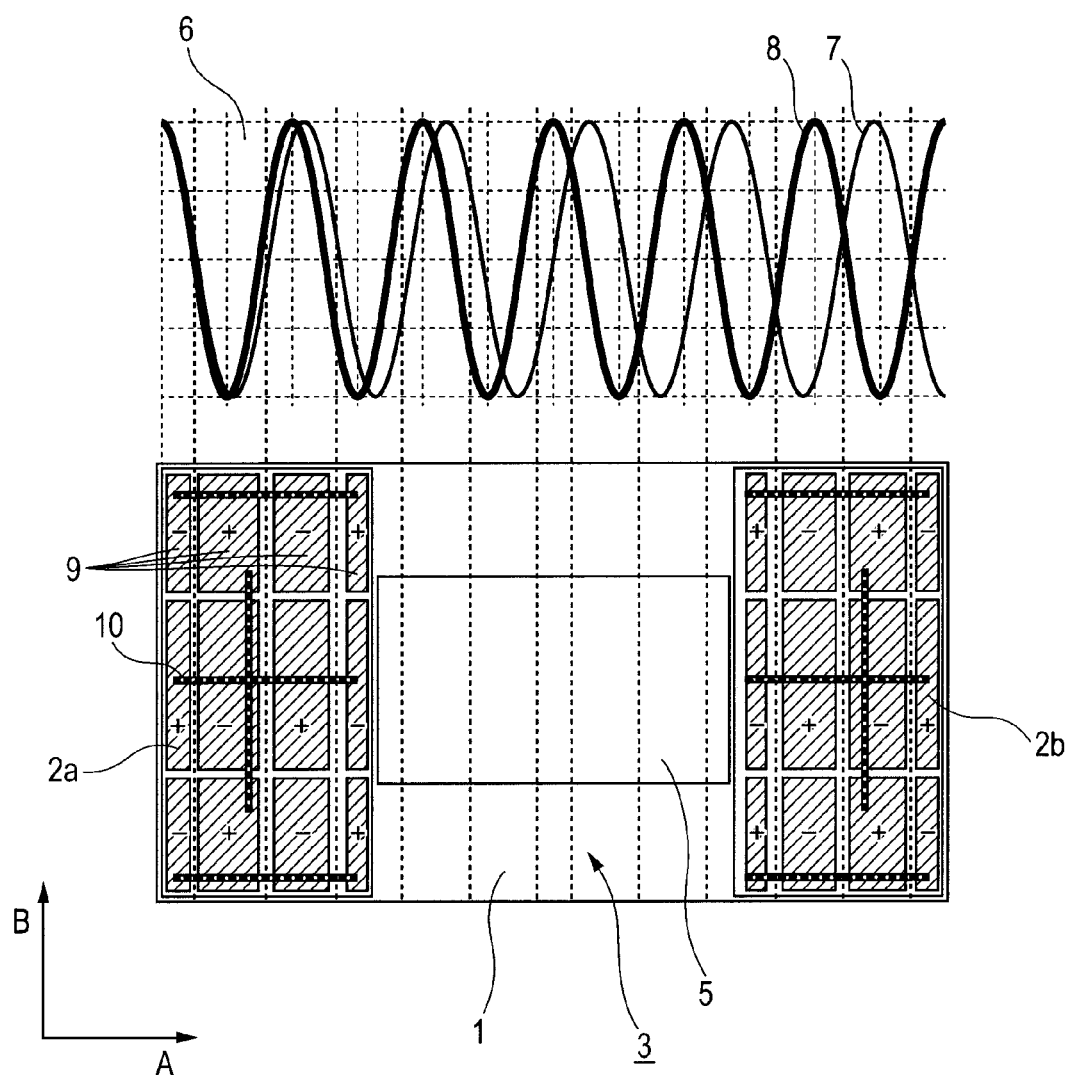
FIG. 7 is a diagram illustrating arrangements of nodal lines and piezoelectric elements in first and second vibration modes and correspondence of electrode patterns according to a second embodiment of the present invention.

Subsequently, the arrangements of the nodal lines and the respective piezoelectric elements 2 (2a and 2b) in the first vibration mode and the second vibration mode and the correspondence of the electrode patterns according to the present embodiment will be described with reference to FIG. 7.

The plot 6 indicates a displacement distribution (7 in the drawing) of the first vibration mode and a displacement distribution (8 in the drawing) of the second vibration mode both excited at the central portion in the up-and-down direction (second direction B) on the vibrator 3. Here, the axis of ordinate indicates the out-of-plane displacement of the optical element 1, and the direction thereof opposite to the surface on which the image pickup element is arranged is set to be positive. The axis of abscissa corresponds to the locations of the optical element 1 in the right-and-left direction on the drawing sheet.

Further, in the present embodiment, the neutral plane of the bending of the two vibrations constitutes the inside of the optical element 1. The deformation due to expansion and contraction arises in the right-and-left direction (first direction A) on the piezoelectric element 2 disposed at the positive place of the deformation, and the deformation due to expansion and contraction arises in the right-and-left direction (first direction A) of an opposite phase (180°) on the piezoelectric element 2 disposed at the negative place of deformation.

Each of the piezoelectric element 2a at the left end and the piezoelectric element 2b at the right end has a rectangular-plate shape, is arranged to extend from one end to the other end of the optical element 1 in the first direction A, and is arranged to extend from the end of the optical element 1 to the optical valid portion in the second direction B.

Each of the piezoelectric elements 2a and 2b has the uniform electrode on the whole rear surface united to the optical element 1, and has the divided electrodes 9 on the opposite front surface.

As indicated by the dotted lines in the drawing, each of the divided places in the right-and-left direction (first direction A) of the divided electrodes 9 is set at the intermediate location between the place of the node at which the displacement in the displacement distribution 7 of the first vibration mode is approximately zero and the place of the node at which the displacement in the displacement distribution 8 of the second vibration mode is approximately zero.

Also, the divided electrodes 9 are arranged in the up-and-down direction (second direction B), and each of the divided places is set at the location where the phases of the deformations due to expansion and contraction in the right-and-left direction (first direction A) and the up-and-down direction (second direction B) of the piezoelectric element 2 are inverted respectively.

In polarization, the electrode of the rear surface is set to ground potential. On the other hand, as indicated by symbols "+" and "−" in the drawing, different-polarity potentials are applied respectively to the adjacent electrodes on the front surface of the divided electrodes 9.

More specifically, polarities "+", "−", "+" and "−" are applied in due order from the left to the divided electrodes at the central portion in the up-and-down direction (first direction A) of the left piezoelectric element 2a, and polarities "+", "−", "+" and "−" are applied in due order from the right to the divided electrodes of the right piezoelectric element 2b. A polarization direction is the thickness direction of the piezoelectric element 2, i.e., the direction orthogonal to the drawing sheet in FIG. 7.

After the polarization, the conductive coating material 10 having conductivity is applied so that it extends over the divided electrodes 9. Consequently, if voltage is applied to any place on the divided electrodes 9, the whole area of the divided electrodes 9 of the one piezoelectric element 2 has same potential.

The alternating voltage $V1 = A1 \times COS(2\pi ft)$ is applied to the left piezoelectric element 2a. Here, A1 indicates the voltage amplitude value, f indicates the frequency, and t indicates the time.

On the other hand, the voltage $V2 = A2 \times COS(2\pi ft+)$ of which the time phase is different from that of the voltage V1 by is applied to the right piezoelectric element 2b. Here, A2 indicates the voltage amplitude value.

As well as the first embodiment, the voltage which mainly contributes to the first vibration mode 7 in which the piezoelectric elements 2a and 2b respectively form the opposite-phase bending deformations is equivalent to the voltage V (difference) corresponding to the component of the difference between the alternating voltages V1 and V2, whereby V (difference)=V1−V2 is given.

On the other hand, the voltage which mainly contributes to the second vibration mode 8 in which the piezoelectric elements 2a and 2b respectively form the same-phase bending deformations is equivalent to the voltage V (sum) corresponding to the component of the sum of the alternating voltages V1 and V2, whereby V (sum)=V1+V2 is given.

Besides, polarization directions of the divided electrodes 9 are arranged in due order such as "−", "+", "−" or "+", "−" "+" from below in the up-and-down direction (second direction B).

Thus, both in the first vibration mode and the second vibration mode, the distribution of the phase of the deformation due to expansion and contraction coincides with the distribution of the phase of the expansion/contraction force in the piezoelectric element 2. Consequently, it is possible to obtain large vibrations in the first vibration mode and the second vibration mode.

Here, the problem in a case where the related background art (United States Patent Application Publication US2009/0207493) is used in the present embodiment will be described.

Figure 8A:
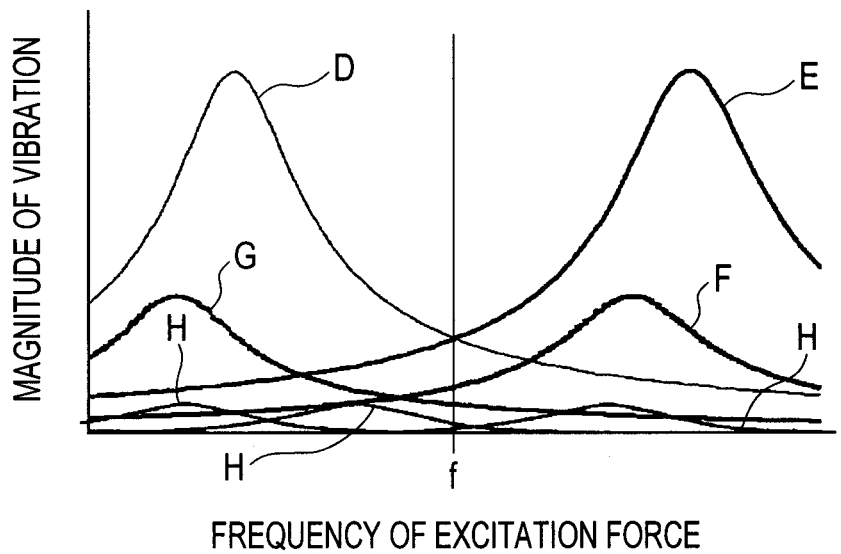
FIG. 8A is a diagram illustrating frequencies of the excitation force and magnitudes of vibrations in the respective vibration modes in the related background art.

FIG. 8A is a graph indicating the frequencies of the excitation force and the magnitudes of the vibrations in the respective vibration modes in a case where the magnitudes of the excitation forces in the two vibration modes to be synthesized are set to be the same, as in the related background art (United States Patent Application Publication US2009/0207493).

In the present embodiment, the above case corresponds to a case where the magnitude of the voltage V (difference) and the magnitude of the voltage V (sum) are set to be the same. In the drawing, D in the plot indicates the magnitude of the vibration in the first vibration mode, and E in the plot indicates the magnitude of the vibration in the second vibration mode.

Since the magnitudes of the excitation forces for these two vibration modes are the same, the magnitudes of the vibrations in the respective natural frequencies are the same.

Further, the magnitude of the vibration becomes small as the frequency of the excitation force goes away from each natural frequency. The magnitude of the vibration at the frequency that the frequency of the excitation force has the same difference from each of the respective natural frequencies is the same in both the first vibration mode D and the second vibration mode E.

As described above, the natural frequency in the first vibration mode D is lower than that in the second vibration mode E.

Incidentally, in the vicinity of the natural frequencies of these vibration modes, there are several other vibration modes (F, G and H in the plot of FIG. 8A) in the vibrator 3.

Since distributions of displacements of other vibration modes are different from those of the first vibration mode D and the second vibration mode E, these modes are unnecessary vibration modes because they interfere with the driving of the foreign substances.

The vibration mode F is the vibration mode (third vibration mode) in which order of bending deformation in the right-and-left direction (first direction A) is the eleventh-order out-of-plane bending deformation as well as the second vibration mode E and the out-of-plane bending deformation does not arise in the up-and-down direction (second direction B).

FIG. 2B indicates the deformed shape of the optical element 1 in the third vibration mode F. Namely, the deformed shape in the third vibration mode F is the shape obtained by eliminating the deformed shape in the up-and-down direction (second direction B) from the deformed shape in the second vibration mode E.

Consequently, the natural frequency in the third vibration mode F is somewhat lower than that in the second vibration mode E. The vibration in the third vibration mode F is especially large among the vibrations in many vibration modes.

The reason why the vibration in the third vibration mode F is especially large will be described hereinafter.

To generate the vibration in the first vibration mode D and the vibration in the second vibration mode E, alternating voltages are applied to the piezoelectric elements 2a and 2b so that expansion/contraction force arises in the right-and-left direction (first direction A) and the up-and-down direction (second direction B), whereby bending deformation force arises in these directions.

As described above, the dividing locations of the divided electrodes 9 correspond to the phase distributions of the expansion/contraction deformations in the first vibration mode D and the second vibration mode E.

On the other hand, in the third vibration mode F, the phase distribution of the expansion/contraction deformation in the first direction A is near the phase distribution of the expansion/contraction force generated in the piezoelectric element 2.

Consequently, the vibration in the third vibration mode F is large. Likewise, the vibration in the vibration mode (fourth vibration mode), in which order of bending in the right-and-left direction (first direction A) of which the magnitude of the vibration is indicated by G in FIG. 8A is the tenth-order out-of-plane bending deformation as well as the first vibration mode D and the out-of-plane bending deformation does not arise in the up-and-down direction (second direction B), is especially large.

FIG. 2A indicates the deformed shape of the optical element 1 in the fourth vibration mode G.

The deformed shape in the fourth vibration mode G is the shape obtained by eliminating the deformed shape in the up-and-down direction (second direction B) from the deformed shape in the first vibration mode D.

Consequently, the natural frequency in the third vibration mode is somewhat lower than that in the first vibration mode D.

The displacement distributions in the up-and-down direction (second direction B) in the third vibration mode F and the fourth vibration mode G are different from those in the first vibration mode D and the second vibration mode E. Consequently, if the vibration in the third vibration mode F or the fourth vibration mode G is large, an uneven vibration arises in the up-and-down direction (second direction B).

If the frequency f (FIG. 8A) which is intermediate between the natural frequency of the first vibration mode D and the natural frequency of the second vibration mode E is assumed as the driving frequency, both the first vibration mode D and the second vibration mode E have larger vibrations.

At this time, the magnitude of the vibration in the third vibration mode F and the magnitude of the vibration in the fourth vibration mode G are compared with each other. Namely, the magnitude of the vibration in the third vibration mode F is larger because the natural frequency of the third vibration mode F is located between the natural frequency of the first vibration mode and the natural frequency of the second vibration mode and a difference between the natural frequency and the driving frequency in the third vibration mode F is smaller.

In the example illustrated in FIG. 8A, the magnitude of the vibration in the third vibration mode F is about half the magnitude of each of the vibration in the first vibration mode D and the vibration in the second vibration mode E, and the magnitude of the vibration in the fourth vibration mode G is about one-quarter the magnitude of each of the vibration in the first vibration mode D and the vibration in the second vibration mode E. Consequently, an uneven vibration further arises in the third vibration mode F than the fourth vibration mode G.

Thus, it is necessary to reduce the vibration in the third vibration mode F in order to prevent the uneven vibration from arising.

In the present embodiment, the driving method in which the excitation voltage V (sum) for the second vibration mode is made higher than the excitation voltage V (difference) for the first vibration mode is adopted.

That is, the vibrator driving method in which the excitation force to one of the first vibration mode and the second vibration mode in which the difference between the natural frequency thereof and the natural frequency of the third vibration mode is smaller is made larger than the excitation force to the other of the first vibration mode and the second vibration mode in which the difference between the natural frequency thereof and the natural frequency of the third vibration mode is larger is adopted.

Subsequently, a function effect by the vibrator driving method according to the present embodiment will further be described with reference to FIG. 8B.

Figure 8B:
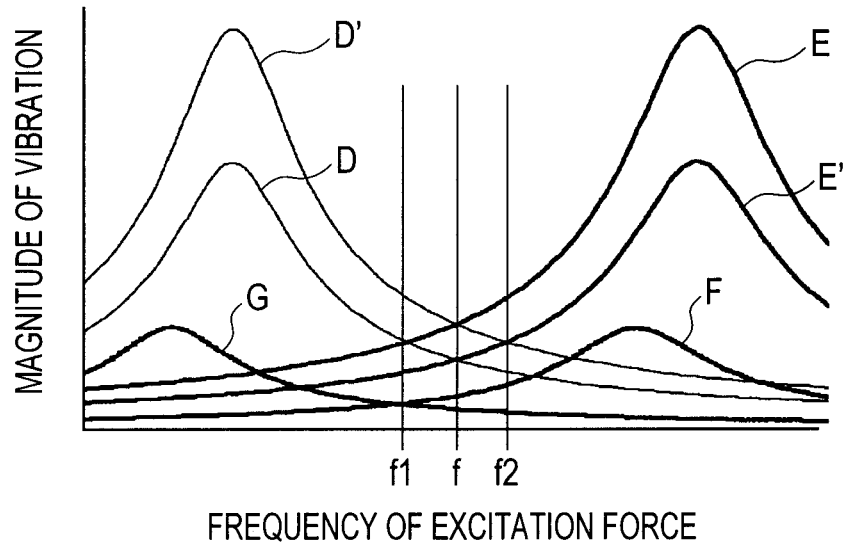
FIG. 8B is a diagram illustrating frequencies of excitation force and magnitudes of vibrations in the respective vibration modes in the second embodiment of the present invention.

FIG. 8B is the graph indicating the frequencies of the excitation force and the magnitudes of the vibrations in the respective vibration modes in the present embodiment.

In the drawing, D in the plot indicates the magnitude of the vibration in the first vibration mode, and E in the plot indicates the magnitude of the vibration in the second vibration mode. Further, F in the plot indicates the magnitude of the vibration in the third vibration mode, and G in the plot indicates the magnitude of the vibration in the fourth vibration mode.

Since the excitation voltage V (sum) for the second vibration mode E is made higher than the excitation voltage V (difference) for the first vibration mode D, the magnitude of the vibration at the natural frequency of the second vibration mode E is larger than the magnitude of the vibration at the natural frequency of the first vibration mode D.

Further, the magnitude of the vibration at the frequency where the frequency of the excitation force has the same difference from each of the natural frequencies in the second vibration mode E is larger.

Since the deformed shape in the third vibration mode F is similar to that in the second vibration mode E, the vibration in the third vibration mode F is somewhat large at the frequency of any excitation force.

At this time, the frequency of the excitation force capable of enlarging the vibrations in both the first vibration mode D and the second vibration mode E is given by f1, whereby the driving frequency is set to f1.

Further, E' in the plot indicates the magnitude of the vibration in the second vibration mode in the case where the magnitude of the voltage V (sum) and the magnitude of the voltage V (difference) are set to be the same, as in the related background art (United States Patent Application Publication US2009/0207493).

In this case, the frequency of the excitation force capable of enlarging the vibrations in both the first vibration mode D and the second vibration mode E' is given by f, whereby the driving frequency is set to f.

The difference between the driving frequency f1 in the present embodiment and the natural frequency of the third vibration mode F is larger than the difference between the driving frequency f in the related background art and the natural frequency of the third vibration mode F, whereby the magnitude of the vibration in the third vibration mode F in the present embodiment can be made smaller.

As described above, since the vibration in the third vibration mode F is large at the frequency of any excitation force, an amount of the relevant vibration is very small.

On the other hand, the difference between the driving frequency and the natural frequency of the fourth vibration mode G is small, and the vibration in the fourth vibration mode G is large. However, the value of the magnitude of the relevant vibration is still sufficiently small.

Thus, it is possible to decrease a response of an unnecessary vibration by distancing the driving frequency from a resonance frequency in the unnecessary vibration mode such as the third vibration mode or the fourth vibration mode, whereby it is possible to increase efficiency of moving the foreign substance.

[Third Embodiment]

In the first embodiment, the driving method of setting the magnitude of the voltage is described as the method of setting the magnitude of the excitation force for the first vibration mode and the second vibration mode.

In the present embodiment, the vibrating apparatus in which the divided electrodes 9 of the piezoelectric element 2 are effectively arranged will be described. Incidentally, the present embodiment is different from the first embodiment in that point that the magnitudes of the voltage (sum) and the voltage (different) are set to be the same. Further, the arrangement of the divided electrodes 9 of the piezoelectric element 2 in the present embodiment is different from that in the first embodiment.

Figure 9:
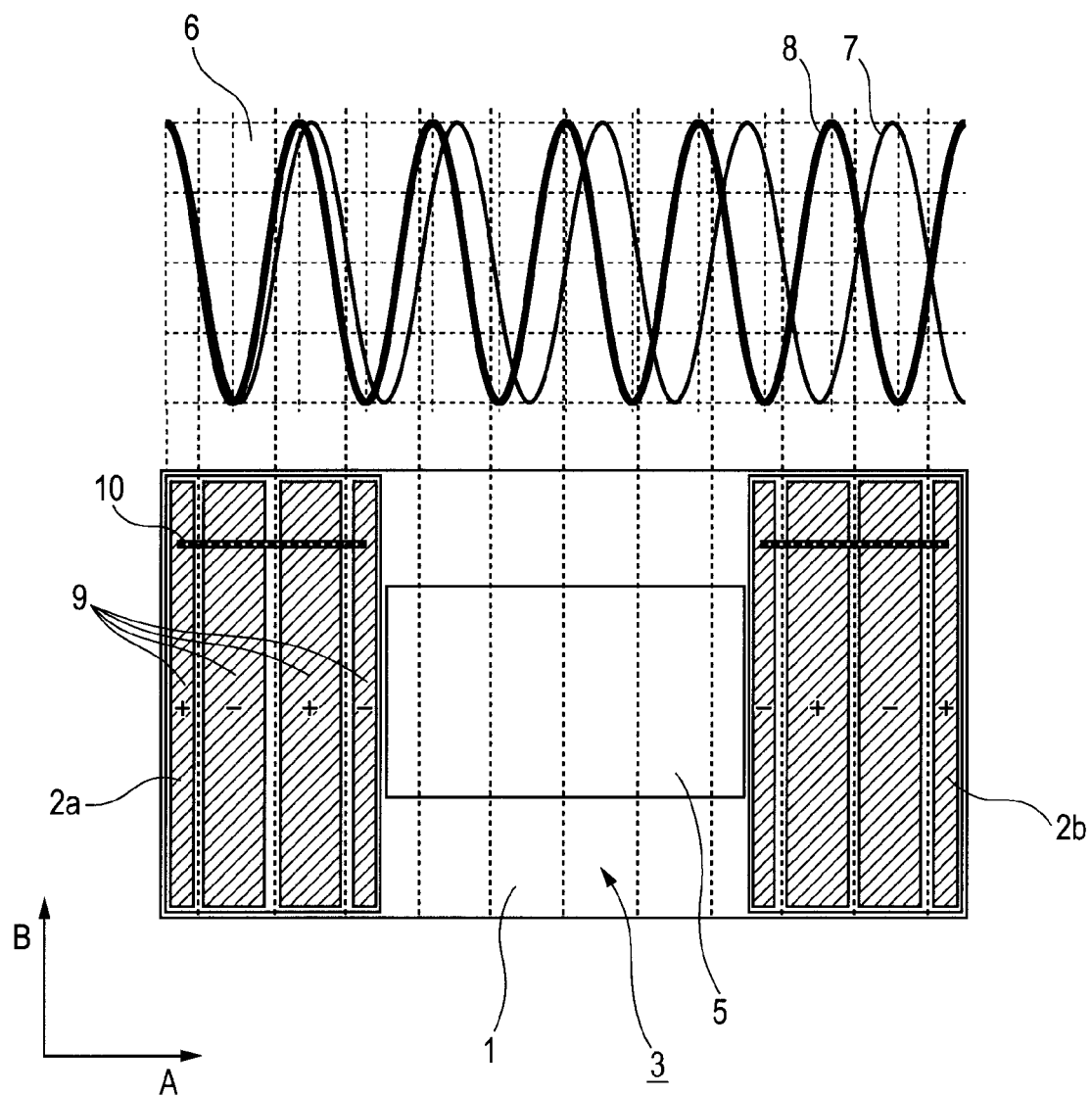
FIG. 9 is a diagram illustrating arrangements of nodal lines and piezoelectric elements in first and second vibration modes and correspondence of electrode patterns according to a third embodiment of the present invention.

Subsequently, the arrangements of the nodal lines and the respective piezoelectric elements 2 in the tenth-order out-of-plane bending vibration mode (first vibration mode) and the eleventh-order out-of-plane bending vibration mode (second vibration mode) and correspondence of the electrode patterns according to the present embodiment will be described with reference to FIG. 9.

The plot 6 indicates the displacement distribution (7 in the drawing) of the first vibration mode and the displacement distribution (8 in the drawing) of the second vibration mode both excited on the vibrator 3.

The axis of ordinate indicates the out-of-plane displacement of the optical element 1, and the direction thereof opposite to the surface on which the image pickup element is arranged is set to be positive. The axis of abscissa corresponds to the locations of the optical element 1 in the right-and-left direction on the drawing sheet.

As indicated by the dotted lines in the drawing, each of the divided places of the divided electrodes 9 is set at the place of the node at which the displacement in the displacement distribution 7 of the first vibration mode 7 is approximately zero.

Thus, the distribution of the phase of the expansion/contraction force in the piezoelectric element 2 coincides with the distribution of the phase of the deformation due to expansion and contraction in the first vibration mode 7, as compared with the first embodiment.

Consequently, it is possible to enlarge the excitation force by the voltage V (difference) for the first vibration mode 7.

On the other hand, the distribution of the phase of the expansion/contraction force in the piezoelectric element 2 and the distribution of the phase of the deformation due to expansion and contraction of the second vibration mode 8 positionally deviate from each other, as compared with the first embodiment. Consequently, it is possible to decrease the excitation force by the voltage V (sum) for the second vibration mode 8.

Thus, the excitation force for the first vibration mode 7 can be made larger than the excitation force for the second vibration mode 8.

Consequently, as well as the above-described first embodiment, it is possible to increase efficiency for moving the foreign substance.

In the constitution according to the present embodiment, the dividing location of the divided electrode 9 of the piezoelectric element 2 approximately coincides with the location of the node in the first vibration mode 7.

Irrespective of the above-described constitution, if the dividing location of the divided electrode 9 of the piezoelectric element 2 is set to be closer to the location of the node of the first vibration mode 7 than the location of the node of the second vibration mode 8, it is also possible to have the effect of the present invention on one level or another.

Further, it is desirable to set the dividing location of the divided electrode to be closer to the location of the nodal line of one of the first vibration mode and the second vibration mode in which the difference between the natural frequency thereof and the natural frequency of the third vibration mode is smaller, than the location of the nodal line of the other of the first vibration mode and the second vibration mode in which the difference between the natural frequency thereof and the natural frequency of the third vibration mode is larger.

Thus, as well as the first embodiment, it is possible to decrease a response of an unnecessary vibration by distancing the driving frequency from a resonance frequency in the unnecessary vibration mode such as the third vibration mode or the like, whereby it is possible to increase efficiency of moving the foreign substance.

Further, in the present embodiment, if the excitation voltage V (difference) for the first vibration mode is made larger than the excitation voltage V (sum) for the second vibration mode, it is possible to further decrease the vibration in the third vibration mode, whereby it is further possible to increase efficiency of moving the foreign substance.

Furthermore, in the present embodiment, also in a case where the dividing location in the right-and-left direction (first direction A) or the up-and-down direction (second direction B) of the divided electrode 9 of the piezoelectric element 2 is set to coincide with or provided in the vicinity of the place of the node of the second vibration mode, it is possible to have the same effect as that in the present embodiment.

[Fourth Embodiment]

Figure 10:
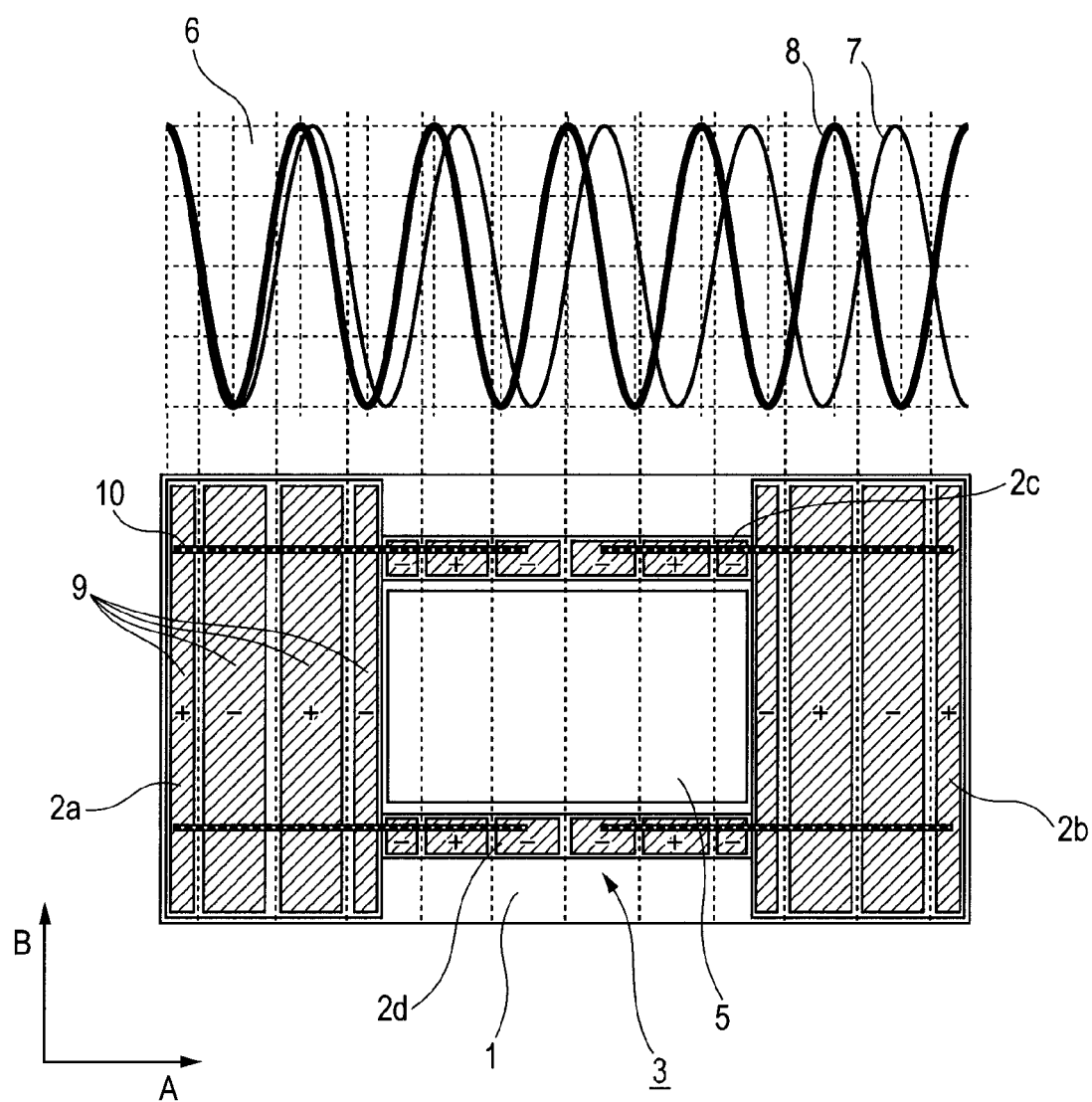
FIG. 10 is a diagram illustrating arrangements of nodal lines and piezoelectric elements in first and second vibration modes and correspondence of electrode patterns according to a fourth embodiment of the present invention.
Figure 12:
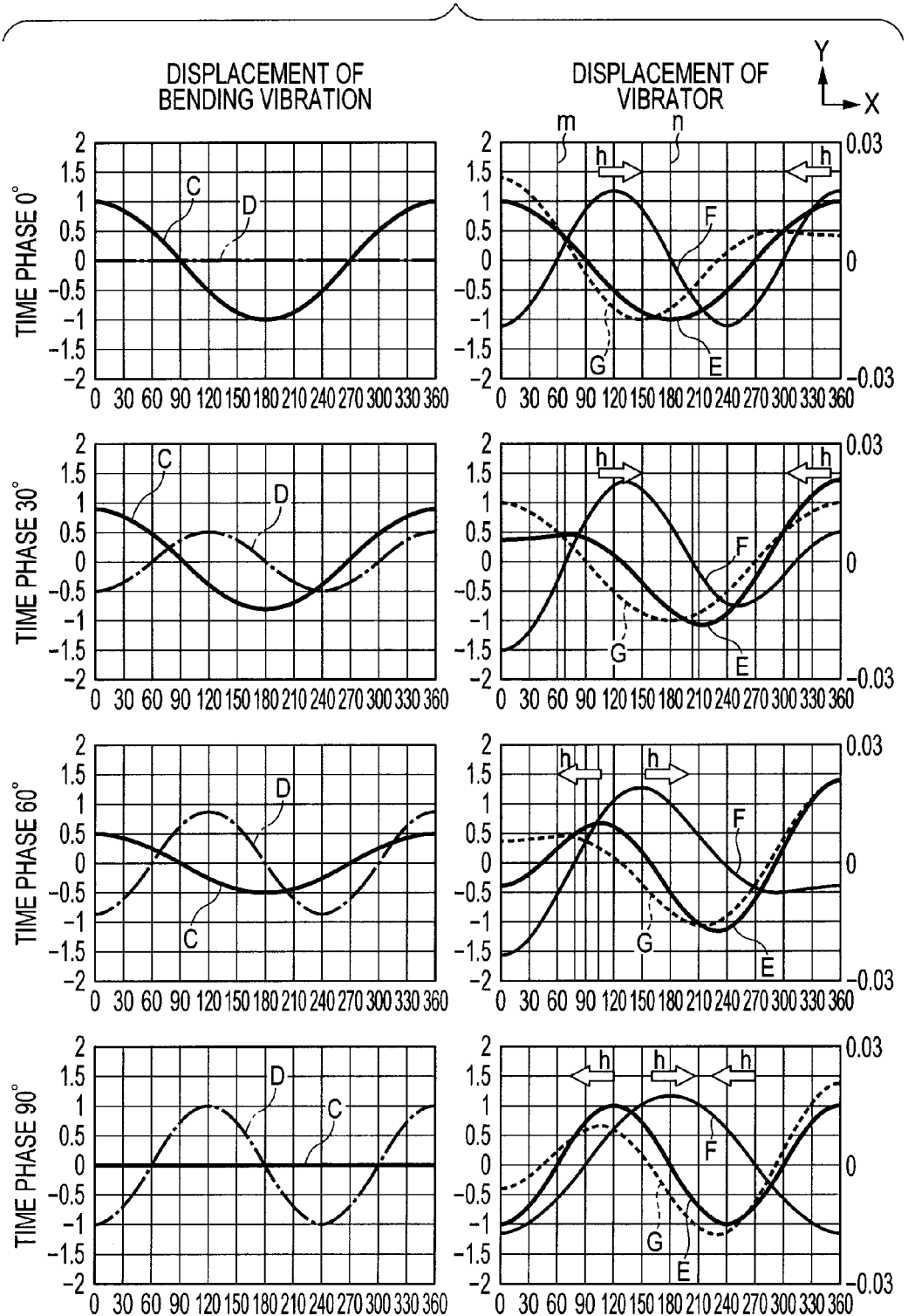
FIG. 12 is a graph indicating respective displacements of the first-order out-of-plane bending vibration and the second-order out-of-plane bending vibration in a case where a phase difference between the two vibrations is set to 90°, and displacement of the vibrator resulting from superposition of the two vibrations, on a time phase-by-time phase basis, in the conventional vibrating apparatus.
Figure 13:
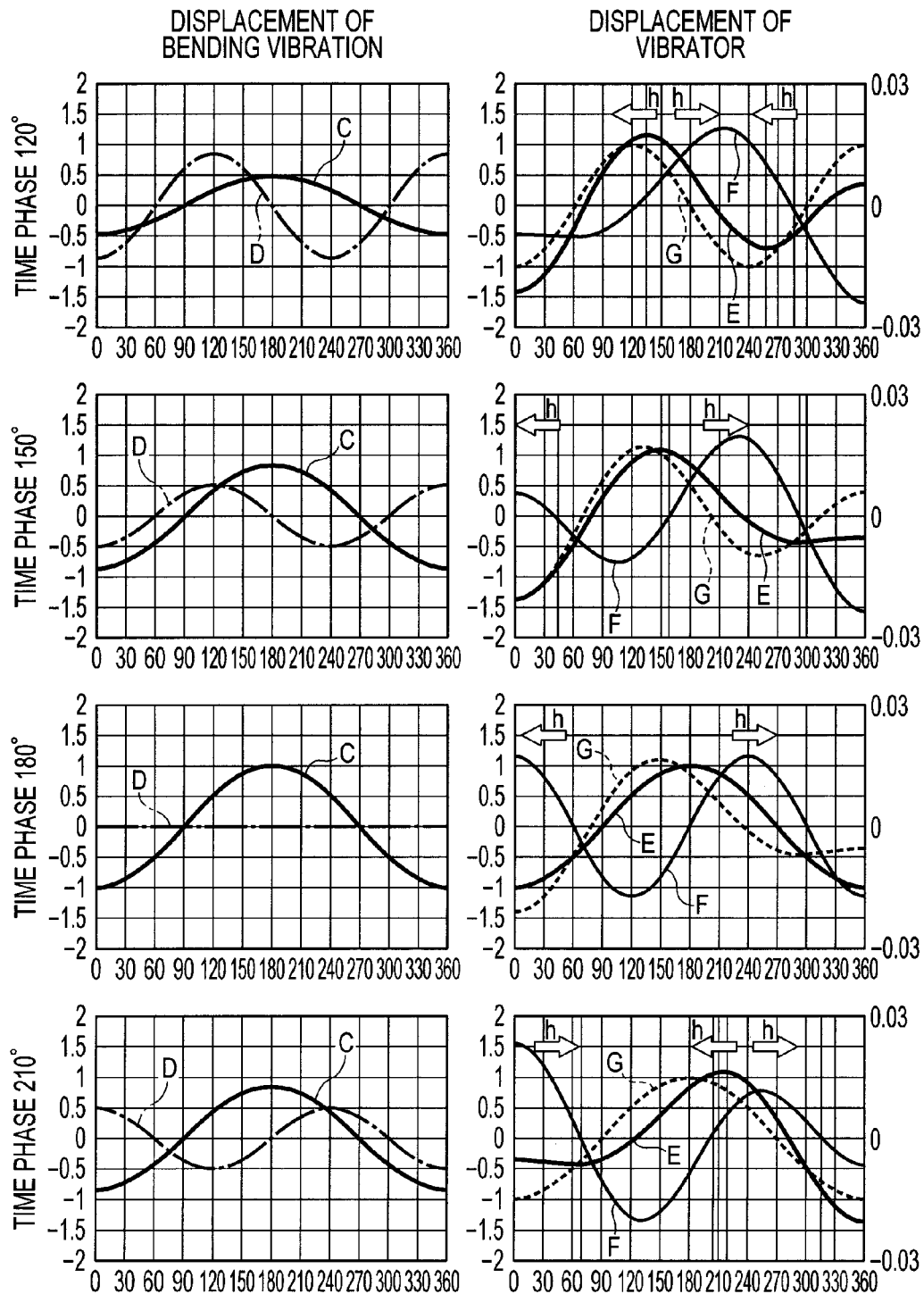
FIG. 13 is a graph indicating respective displacements of the first-order out-of-plane bending vibration and the second-order out-of-plane bending vibration in the case where the phase difference between the two vibrations is set to 90°, and displacement of the vibrator resulting from superposition of the two vibrations, on a time phase-by-time phase basis, in the conventional vibrating apparatus.
Figure 14:
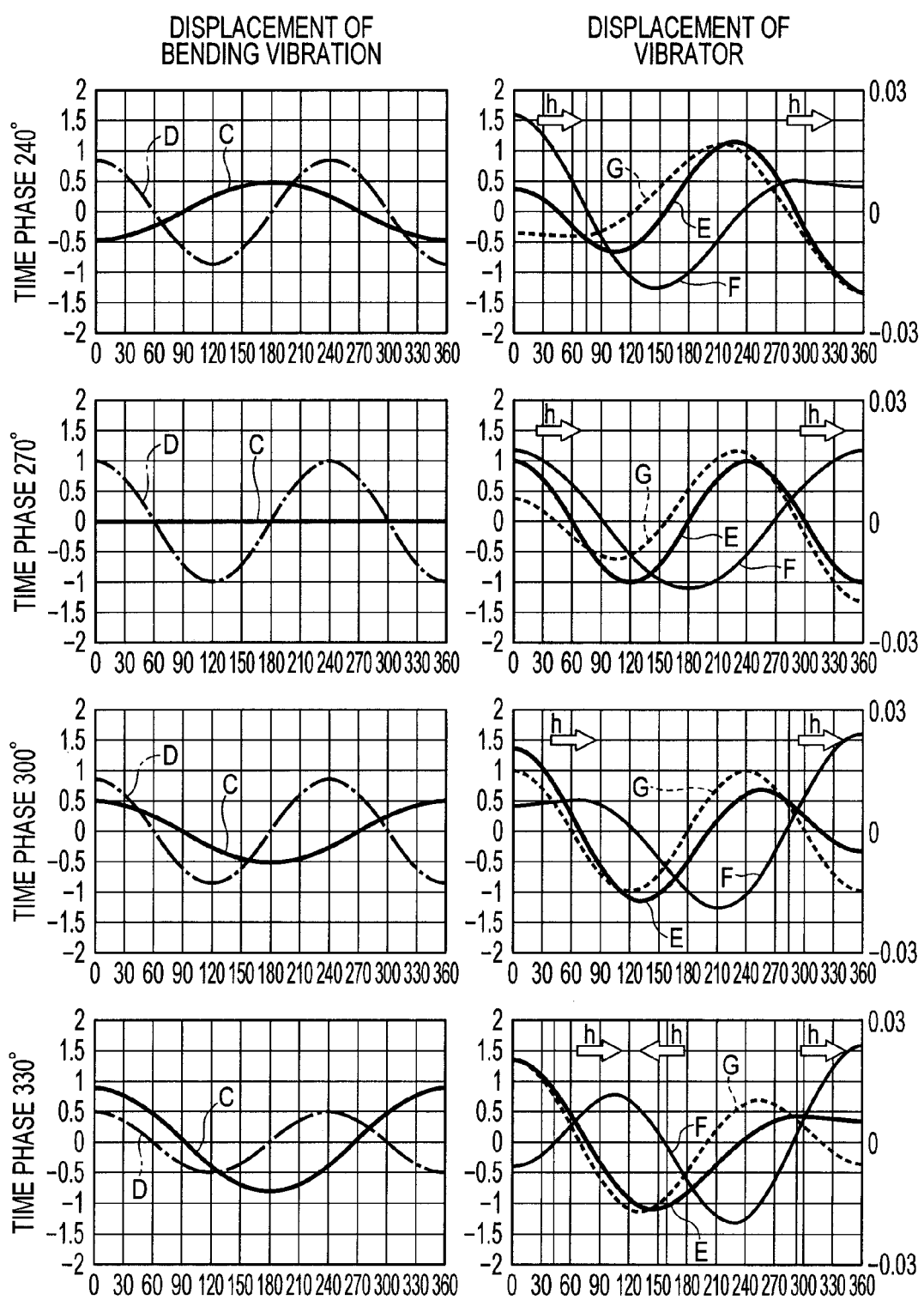
FIG. 14 is a graph indicating respective displacements of the first-order out-of-plane bending vibration and the second-order out-of-plane bending vibration in the case where the phase difference between the two vibrations is set to 90°, and displacement of the vibrator resulting from superposition of the two vibrations, on a time phase-by-time phase basis, in the conventional vibrating apparatus.
Figure 15:
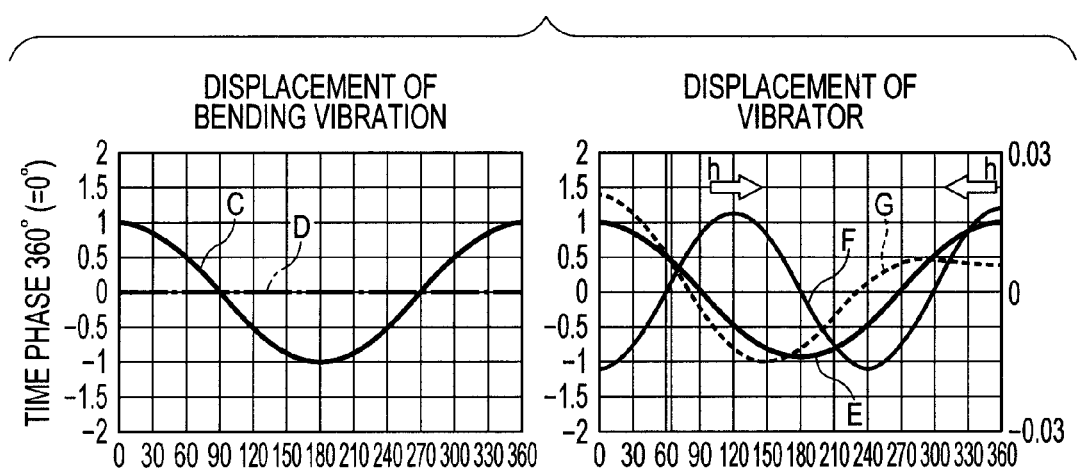
FIG. 15 is a graph indicating respective displacements of the first-order out-of-plane bending vibration and the second-order out-of-plane bending vibration in the case where the phase difference between the two vibrations is set to 90°, and displacement of the vibrator resulting from superposition of the two vibrations, on a time phase-by-time phase basis, in the conventional vibrating apparatus.

The present embodiment is different from the third embodiment in the point that the four piezoelectric elements 2 are provided since piezoelectric elements 2c and 2d illustrated in FIG. 10 are further added.

More specifically, the piezoelectric elements 2a and 2b are provided so that their long sides are arranged along the second direction B, while the piezoelectric elements 2c and 2d are provided so that their long sides are arranged along the first direction A.

Consequently, it is possible to arrange more divided electrodes in the first direction A.

The dividing locations of the divided electrodes 9 in the piezoelectric elements 2c and 2d are disposed so as to coincide with the respective locations of the nodes of the first vibration mode 7.

As indicated by symbols "+" and "−" in the drawing, polarization directions of the divided electrodes 9 in the piezoelectric elements 2c and 2d are arranged in due order as "−", "+", "−" respectively from both the right and left ends so as to be linked to the arrangements of the piezoelectric elements 2a and 2b in the polarization direction.

Consequently, it is possible to further enlarge the excitation force for the first vibration mode 7 when the voltage V (difference) is applied.

Thus, it is possible to further increase efficiency of moving the foreign substance, as compared with the third embodiment.

Further, the locations where the piezoelectric elements 2c and 2d are located are set so that the central location thereof in the up-and-down direction (second direction B) coincides with the location of the nodal line of the third vibration mode.

Consequently, it is set that the excitation force for the third vibration mode is hard to generate, by the relation of the phase distribution of the deformation due to expansion and contraction and the phase distribution of expansion/contraction force in the up-and-down direction (second direction B) in the third vibration mode.

[Other Embodiments]

Even in a case where a vibration mode other than the vibration modes in the above-described embodiments is synthesized to move an object, it is possible to have the above-described effect of the present invention if magnitude of the excitation force is set in consideration of the relation of the natural frequencies of the vibration modes intended in the present invention.

Further, the rectangular vibrator is used as a representative vibrator in the above-described embodiments. However, it is possible to use a vibrator which has any shape such as a disk shape, a polygonal shape and the like. Namely, the present invention does not limit the shape of the vibrator.

Furthermore, as a method of controlling the magnitude of the excitation force, the present invention also includes a method of increasing or decreasing a piezoelectric characteristic in regard to the portion which has coincidence by a deformation distribution of one of the vibration modes, and a method of, in case of using a laminated piezoelectric element, increasing or decreasing the number of laminations.

Besides, the present invention can also include a method of changing a lamination thickness, and a method of externally applying excitation force to the vibrator. Namely, the method of controlling the magnification of the excitation force is not specifically limited.

The vibrating apparatus and the vibrator driving method in the above-described embodiments can be applied to a driving apparatus, thereby constituting the driving apparatus which drives an object in a predetermined direction.

Moreover, the vibrating apparatus and the vibrator driving method can be applied to a foreign substance removing apparatus, thereby constituting the foreign substance removing apparatus which removes a foreign substance by moving it in a predetermined direction.

Moreover, the above foreign substance removing apparatus can be applied to an optical apparatus, thereby constituting the optical apparatus which removes a foreign substance on an optical path.

More specifically, the above foreign substance removing apparatus can be applied to the optical apparatus such as a camera, a facsimile apparatus, a scanner, a projector, a copying apparatus, a laser beam printer, an inkjet printer, a lens, binoculars, an image displaying apparatus, or the like.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-058772, filed Mar. 16, 2010, which is hereby incorporated by reference herein in its entirety.

What is claimed is:

1. A vibrator driving method of applying an alternating voltage to at least two electromechanical energy conversion elements provided in a vibrator, and thus causing the vibrator to generate standing waves respectively different in order with a predetermined time phase difference, wherein the vibrator has a first vibration mode in which plural nodal lines are arranged in a first direction, a second vibration mode in which the number of nodal lines arranged in the first direction is different from that in the first vibration mode and of which a natural frequency is higher than a natural frequency of the first vibration mode, and a third vibration mode of which a natural frequency is located between the natural frequency of the first vibration mode and the natural frequency of the second vibration mode, the number of nodal lines arranged in the first direction in the third vibration mode is the same as that in the first vibration mode or that in the second vibration mode, and the number of nodal lines arranged in a second direction intersecting with the first direction in the third vibration mode is different from that in the first vibration mode or that in the second vibration mode, and the vibrator is driven on condition that an excitation force in one of the first vibration mode and the second vibration mode in which a difference between the natural frequency thereof and the natural frequency of the third vibration mode is smaller is made larger than an excitation force in the other of the first vibration mode and the second vibration mode in which a difference between the natural frequency thereof and the natural frequency of the third vibration mode is larger.

2. The vibrator driving method according to Claim 1, wherein the vibrator is driven on condition that an excitation voltage for exciting in the one of the first vibration mode and the second vibration mode in which the difference between the natural frequency thereof and the natural frequency of the third vibration mode is smaller is made larger than an excitation voltage for exciting in the other of the first vibration mode and the second vibration mode in which the difference between the natural frequency thereof and the natural frequency of the third vibration mode is larger.

3. A driving apparatus comprising a vibrating apparatus which uses the vibrator driving method described in claim 1, wherein the driving apparatus drives an object in a predetermined direction by the vibrating apparatus.

4. A foreign substance removing apparatus comprising a vibrating apparatus which uses the vibrator driving method described in claim 1,
wherein the foreign substance removing apparatus removes a foreign substance by moving it in a predetermined direction by the vibrating apparatus.

5. An optical apparatus comprising the foreign substance removing apparatus described in claim 4,
wherein the optical apparatus removes a foreign substance on an optical path by the foreign substance removing apparatus.

6. A vibrating apparatus which comprises a vibrator having at least two electromechanical energy conversion elements, and applies an alternating voltage to the electromechanical energy conversion elements and thus causes the vibrator to generate standing waves respectively different in order with a predetermined time phase difference, wherein the vibrator has a first vibration mode in which plural nodal lines are arranged in a first direction, a second vibration mode in which the number of nodal lines arranged in the first direction is different from that in the first vibration mode and of which a natural frequency is higher than a natural frequency of the first vibration mode, and a third vibration mode of which a natural frequency is located between the natural frequency of the first vibration mode and the natural frequency of the second vibration mode, the number of nodal lines arranged in the first direction in the third vibration mode is the same as that in the first vibration mode or that in the second vibration mode, and the number of nodal lines arranged in a second direction intersecting with the first direction in the third vibration mode is different from that in the first vibration mode or that in the second vibration mode, at least one of the electromechanical energy conversion elements has plural divided electrodes, and a dividing location of the divided electrodes is set to be closer to a location of the nodal line of one of the first vibration mode and the second vibration mode in which a difference between the natural frequency thereof and the natural frequency of the third vibration mode is smaller, than a location of the nodal line of the other of the first vibration mode and the second vibration mode in which a difference between the natural frequency thereof and the natural frequency of the third vibration mode is larger.

7. The vibrating apparatus according to claim 6, wherein the location of the nodal line of the one of the first vibration mode and the second vibration mode in which the difference between the natural frequency thereof and the natural frequency of the third vibration mode is smaller substantially coincides with the dividing location of the divided electrodes.

8. A driving apparatus comprising the vibrating apparatus described in claim 6,
wherein the driving apparatus drives an object in a predetermined direction by the vibrating apparatus.

9. A foreign substance removing apparatus comprising the vibrating apparatus described in claim 6,
wherein the foreign substance removing apparatus removes a foreign substance by moving it in a predetermined direction by the vibrating apparatus.

10. An optical apparatus comprising the foreign substance removing apparatus described in claim 9,
wherein the optical apparatus removes a foreign substance on an optical path by the foreign substance removing apparatus.

* * * * *